(12) United States Patent
Micko et al.

(10) Patent No.: US 9,301,412 B2
(45) Date of Patent: Mar. 29, 2016

(54) DUAL FIXED ANGLE SECURITY MOUNT

(71) Applicant: Greenwave Systems, PTE. LTD., Singapore (SG)

(72) Inventors: Eric Scott Micko, Singapore (SG); Sonny Windstrup, Singapore (SG); Martin Manniche, Laguna Hills, CA (US)

(73) Assignee: Greenwave Systems PTE. LTD., Singapore (SG)

( * ) Notice: Subject to any disclaimer, the term of this patent is extended or adjusted under 35 U.S.C. 154(b) by 32 days.

(21) Appl. No.: 14/292,998

(22) Filed: Jun. 2, 2014

(65) Prior Publication Data

US 2015/0351266 A1 Dec. 3, 2015

(51) Int. Cl.
| | |
|---|---|
| *H05K 7/02* | (2006.01) |
| *H05K 5/02* | (2006.01) |
| *F16B 1/00* | (2006.01) |
| *F16M 13/02* | (2006.01) |
| *H01F 7/02* | (2006.01) |

(52) U.S. Cl.
CPC .............. *H05K 5/0217* (2013.01); *F16B 1/00* (2013.01); *F16M 13/022* (2013.01); *F16M 13/025* (2013.01); *H01F 7/0252* (2013.01); *F16B 2001/0035* (2013.01); *Y10T 29/49782* (2015.01); *Y10T 29/49948* (2015.01)

(58) Field of Classification Search
CPC .. H05K 3/301; Y10T 29/49826; Y10T 24/32; Y10T 29/49126; A63H 17/264; F16M 11/14; F16M 13/022; G01D 11/245; G01J 5/04; G01J 5/0843; Y10S 403/01; G01S 7/4813

USPC ........................................ 361/807, 809, 810
See application file for complete search history.

(56) References Cited

U.S. PATENT DOCUMENTS

| | | |
|---|---|---|
| 5,105,084 A | 4/1992 | Nagai et al. |
| 5,923,250 A | 7/1999 | Pildner et al. |

(Continued)

FOREIGN PATENT DOCUMENTS

| | | |
|---|---|---|
| EP | 2533026 A | 12/2012 |
| KR | 1020100065897 A | 6/2010 |

(Continued)

OTHER PUBLICATIONS

Korean Intellectual Property Office, International Search Report for PCT/US2015/030692, Aug. 26, 2015.

(Continued)

*Primary Examiner* — Tuan T Dinh
*Assistant Examiner* — Hung Dang
(74) *Attorney, Agent, or Firm* — Bruce A. Young

(57) ABSTRACT

A security apparatus includes a mount and a sensor body with a socket recessed into the sensor body at a first angle from a functionality plane. The mount includes a stem and a base adapted to be affixed to a wall. The stem extends from the base at a second angle from horizontal. The functionality plane is set at an angle from horizontal equal to the first angle plus the second angle if the stem is inserted into the socket with the first side of the stem in close proximity to the first wall of the socket, and the functionality plane of the sensor body is set at an angle from horizontal equal to the first angle minus the second angle if the stem is inserted into the socket with the first side of the stem in close proximity to the second wall of the socket.

26 Claims, 12 Drawing Sheets

(56) References Cited

U.S. PATENT DOCUMENTS

| | | | |
|---|---|---|---|
| 6,163,025 A | 12/2000 | Pantus | |
| 6,340,816 B1 | 1/2002 | Micko | |
| 6,350,076 B1 * | 2/2002 | Wagner | A61B 19/26 403/122 |
| 6,559,448 B1 | 5/2003 | Mueller et al. | |
| 7,042,134 B2 | 5/2006 | Micko | |
| 7,075,431 B2 | 7/2006 | Buckley et al. | |
| 7,141,910 B2 | 11/2006 | Micko | |
| 7,183,912 B2 | 2/2007 | Micko | |
| 7,352,107 B2 | 4/2008 | Micko | |
| 7,399,969 B2 | 7/2008 | Micko | |
| 7,399,970 B2 | 7/2008 | Micko | |
| 7,498,576 B2 | 3/2009 | Micko | |
| 7,579,595 B2 | 8/2009 | Micko | |
| 7,622,845 B2 | 11/2009 | Micko | |
| 7,628,551 B2 | 12/2009 | Leyden et al. | |
| 7,755,052 B2 | 7/2010 | Micko | |
| 7,909,521 B2 | 3/2011 | Son | |
| 8,314,390 B2 | 11/2012 | Micko | |
| 8,354,643 B2 | 1/2013 | Micko | |
| 8,378,820 B2 | 2/2013 | Micko | |
| 8,414,201 B2 | 4/2013 | Skeoch et al. | |
| 2004/0118985 A1 * | 6/2004 | Omps | F16C 11/0619 248/181.1 |
| 2004/0164647 A1 | 8/2004 | Micko | |
| 2004/0169145 A1 | 9/2004 | Micko | |
| 2005/0061979 A1 | 3/2005 | Narasako et al. | |
| 2005/0184869 A1 | 8/2005 | Micko | |
| 2005/0247845 A1 | 11/2005 | Li et al. | |
| 2006/0138329 A1 * | 6/2006 | Wu | G01D 11/245 250/342 |
| 2006/0254999 A1 * | 11/2006 | Senften | A63H 19/18 213/70 |
| 2007/0030148 A1 | 2/2007 | Gabriel et al. | |
| 2007/0114346 A1 | 5/2007 | Omps | |
| 2009/0065671 A1 * | 3/2009 | Burgstaller | E04F 13/0808 248/288.31 |
| 2009/0196597 A1 | 8/2009 | Messinger et al. | |
| 2009/0302220 A1 | 12/2009 | Micko | |
| 2015/0233702 A1 | 8/2015 | Micko | |
| 2015/0233765 A1 | 8/2015 | Micko | |

FOREIGN PATENT DOCUMENTS

| | | |
|---|---|---|
| KR | 1020100109125 A | 10/2010 |
| KR | 1020100116828 A | 11/2010 |

OTHER PUBLICATIONS

Korean Intellectual Property Office, Written Opinion of the International Searching Authority for PCT/US2015/030692, Aug. 26, 2015.

USPTO, Notice of Allowance for U.S. Appl. No. 14/699,277, Aug. 18, 2015.

NETGEAR, VueZone Wireless Video Cameras: How it Works—Internet Web Page dated Oct. 6, 2012, retrieved from "https://web.archive.org/web/20111121082129/http://www.vuezone.com/learn-more/how-it-works" on Jun. 23, 2015.

Windstrup et al., Unpublished Design U.S. Appl. No. 29/478,518, filed Jan. 6, 2014.

* cited by examiner

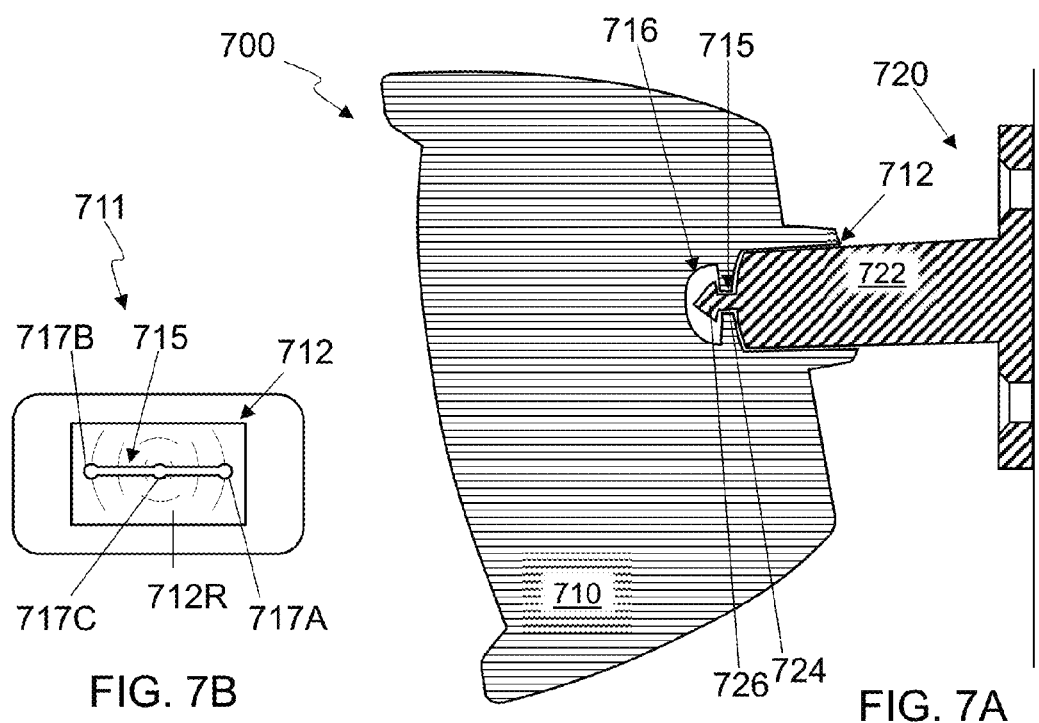

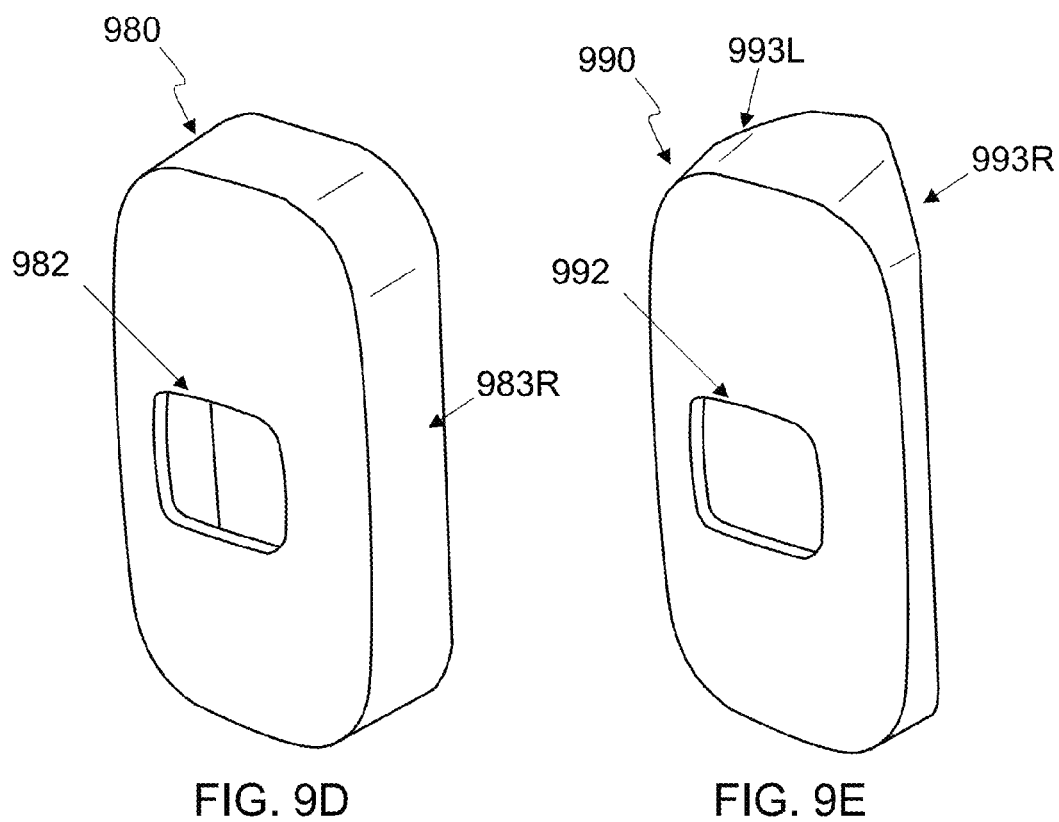

DUAL FIXED ANGLE SECURITY MOUNT

CROSS-REFERENCE TO RELATED APPLICATIONS

This application is related to U.S. Provisional Patent Application No. 62/006,284, filed the same day as the present application and entitled "Magnetic Mount for Security Device," the entire contents of which are hereby incorporated by reference for any and all purposes. This application is also related to International Patent Application No. PCT/US2013/073799, filed on Dec. 9, 2013 and entitled "Motion Detection," the entire contents of which are hereby incorporated by reference for any and all purposes.

BACKGROUND

1. Technical Field

The present subject matter relates to mounts for security devices. More specifically it relates to a mount providing two different fixed angles for a security device.

2. Background Art

Many types of security devices are in common use today. Examples of security devices include, but are not limited to, motion sensors such as infrared motion sensors and ultrasonic motion sensors, security cameras such as still image cameras, visible wavelength video cameras, and cameras sensitive to invisible wavelengths such as infrared or ultraviolet, light beam interruption sensors, chemical detectors such as smoke alarms, carbon dioxide detectors, and explosive gas detectors, sound detection devices such as glass breakage detectors or microphones, water sensors, and pressure sensors. Some security devices have specific mounting requirements and are mounted in a specific place and/or orientation to properly operate. Some security devices have a specific detection pattern or direction of sensitivity that is pointed in the proper direction to allow for detection of the threat from a specific location.

Some security devices are designed to be used with a particular mount. One type of mount that is commonly used is a tilt and swivel adapter that is attached to a standard electrical junction box. Such a tilt and swivel mount allows the installer or user to change the azimuth and elevation of the security device to virtually any angle, providing a great deal of flexibility. Such a mount can be useful for some applications where a wide range of angles are needed for different installation situations.

Some security devices are designed to operate at a specific angle for their azimuth and/or elevation. In some cases, a specific mount is supplied with the security device to provide for the one specific angle. One example of this is a security device to be mounted on a ceiling and designed to point straight down, so the mount is designed to hold the security device in that position and is provided with the security device.

BRIEF DESCRIPTION OF THE DRAWINGS

The accompanying drawings, which are incorporated in and constitute part of the specification, illustrate various embodiments. Together with the general description, the drawings serve to explain various principles. In the drawings:

FIG. 7A shows a vertical cross-sectional view of an embodiment of a security apparatus with the stem of the mount held in the socket by a snap-in mechanism;

FIG. 7B shows a rear view of the socket of the embodiment of the sensor body of the security apparatus of FIG. 7A;

FIGS. 9D and 9E show two different embodiments of covers for the mount of FIG. 9A-C.

DETAILED DESCRIPTION

Figure 1A:
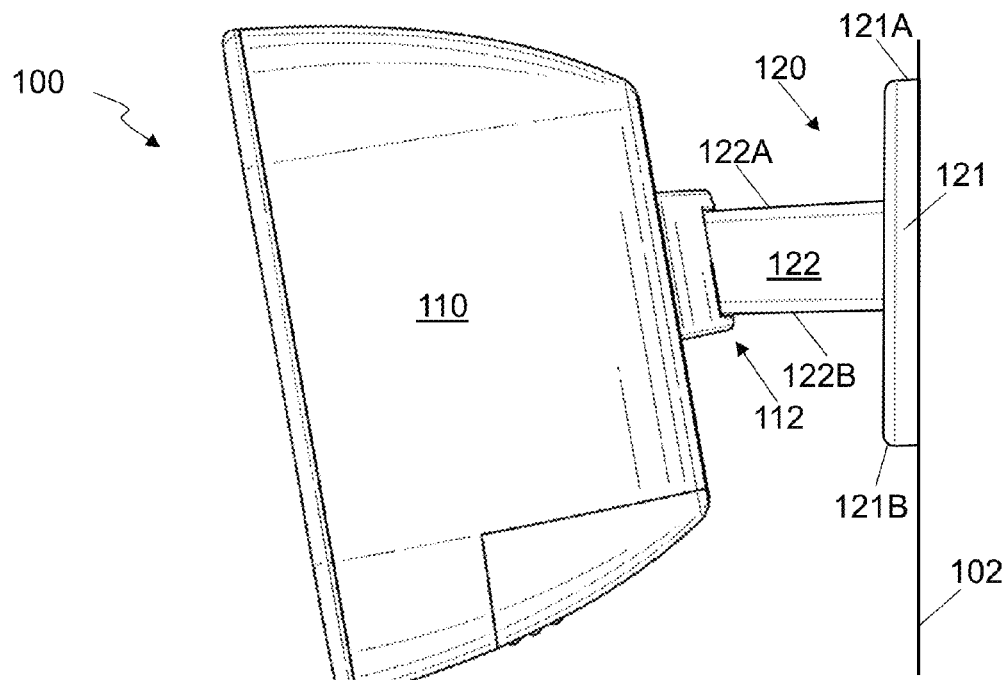
FIGS. 1A and 1B show an embodiment of a motion sensor body on a mount, where the mount is oriented in a first orientation in FIG. 1A and in a second orientation in FIG. 1B.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures and components have been described at a relatively high-level, without detail, in order to avoid unnecessarily obscuring aspects of the present concepts. A number of descriptive terms and phrases are used in describing the various embodiments of this disclosure. These descriptive terms and phrases are used to convey a generally agreed upon meaning to those skilled in the art unless a different definition is given in this specification. Some descriptive terms and phrases are presented in the following paragraphs for clarity.

Magnetic material is a material that may be attracted to a magnet. Magnetic material may or may not remain magnetized without an external magnetic field. Examples of magnetic material include a magnet, steel, or other ferromagnetic materials.

A magnet is a magnetic material that generates a magnetic field, or is magnetized, even if the magnet is not being subjected to an external magnetic field. A magnet may also be referred to as a permanent magnet.

Ferromagnetic material, for the purposes of this disclosure, including the claims, refers to a magnetic material that does not generate a significant magnetic field of its own, or is not magnetized, without the presence of an external magnetic field. Ferromagnetic materials are attracted to a magnet. Ferromagnetic materials may include iron, nickel, cobalt, and many of their alloys, such as many steel alloys, as well as some compounds of rare earth metals. For the purposes of this disclosure, ferromagnetic materials include ferrimagnetic materials that are attracted to a magnet.

A security apparatus is an apparatus used for some type of security or monitoring application such as monitoring an area for some type of activity or event or providing an area with acoustical waves or electro-magnetic radiation such as radio waves, or light in the visible or invisible spectrum. Examples of a security apparatus include, but are not limited to, motion sensors such as infrared motion sensors and ultrasonic motion sensors, occupancy sensors, cameras such as still image cameras, visible wavelength video cameras, and cameras sensitive to invisible wavelengths such as infrared or ultraviolet, light beam interruption sensors, chemical detectors such as smoke alarms, carbon dioxide detectors, and explosive gas detectors, sound detection devices such as glass breakage detectors or microphones, water sensors, pressure sensors, speakers, ultrasonic transducers, infrared illumination sources, and visible light illumination sources.

One example of a security apparatus is a motion sensor designed to monitor an area of about 16'×16' (about 5 meters squared) for minor body movement and an area of about 20'×20' (about 6 meters squared) for major body motion. A mount is included to allow the motion sensor to be mounted within a one of two height ranges at the discretion of the installer: about 6' 6"-8' 6" (~2 m-2.6 m) or about 8' 6"-11' 10" (~2.6 m-~3.6 m). If the motion sensor is to be mounted in the higher height range, the mount is attached to the wall in a first orientation, but if the motion sensor is to be mounted in the lower height range, the mount is attached to the wall in a second orientation.

The mount can be mounted along a vertical line on a flat wall or in a corner. Two holes can be drilled on the vertical line to accommodate the two mounting screw holes in the base of the mount. To attach the mount to the wall in the first orientation, the mount is installed with the stem sloping downward and the "10°" marking upright. To attach the mount to the wall in the second orientation, the mount is stalled with the stem sloping upward and the "5°" marking upright. Once the mount is attached to the wall, the socket on the back of the motion sensor is slipped on the stem with the motion sensor upright. If the mount was installed in the first orientation, the motion sensor will look like it is pointed about 10° down, but if the mount was installed in the second orientation, the motion sensor will look like it is pointed about 5° down. This is accomplished due to the elevation angle of the motion sensor being dependent on the angle between the socket and the horizontal plane of the motion sensor, the angle of the stem from horizontal, and the orientation of the mount.

In one example, the angle between the socket and the horizontal plane of the motion sensor is about 7.5° and the angle of the stem from horizontal is about 2.5°. If the mount is attached to the wall in the first orientation with the stem sloping downward, the angle of the motion sensor from horizontal is equal to the angle between the socket and the horizontal plane of the motion sensor plus the angle of the stem from horizontal, or about 7.5°+2.5°=10°. If the mount is attached to the wall in the second orientation with the stem sloping upward, the angle of the motion sensor from horizontal is equal to the angle between the socket and the horizontal plane of the motion sensor minus the angle of the stem from horizontal, or about 7.5°−2.5°=5°.

The example motion sensor can monitor an area about +/−45° from its pointing direction for a total azimuth coverage range of about 90°. Thus, an entire room can be covered by mounting the sensor in one corner. For other applications, the motion sensor can be mounted on a flat wall and an azimuth angle selected for the motion sensor by positioning the stem of the mount at an appropriate location within the socket.

Reference now is made in detail to the examples illustrated in the accompanying drawings and discussed below.

Figure 1B:
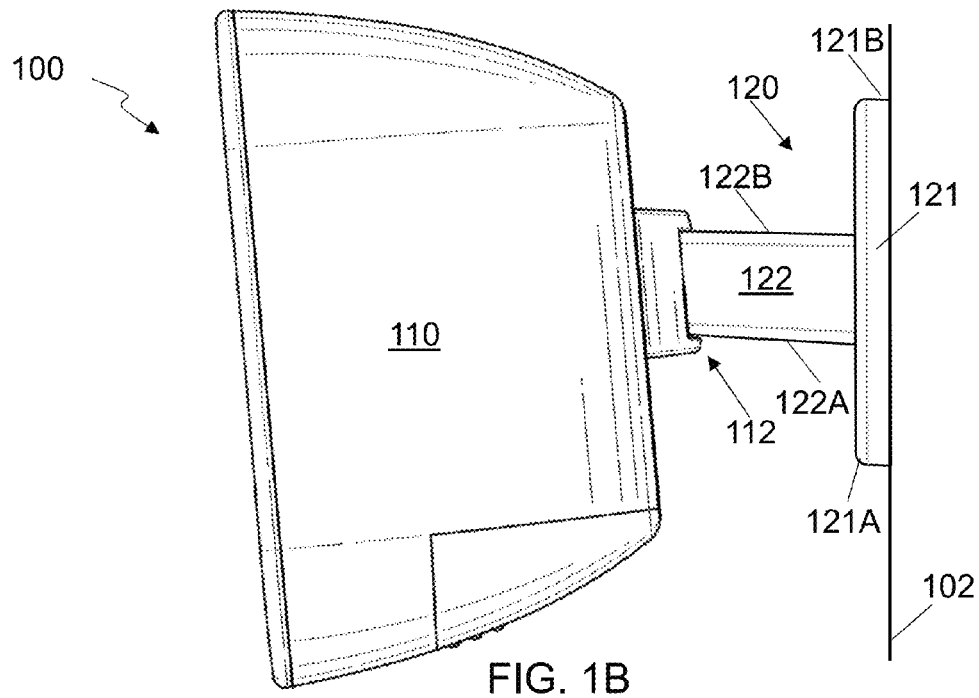
Figure 1C:
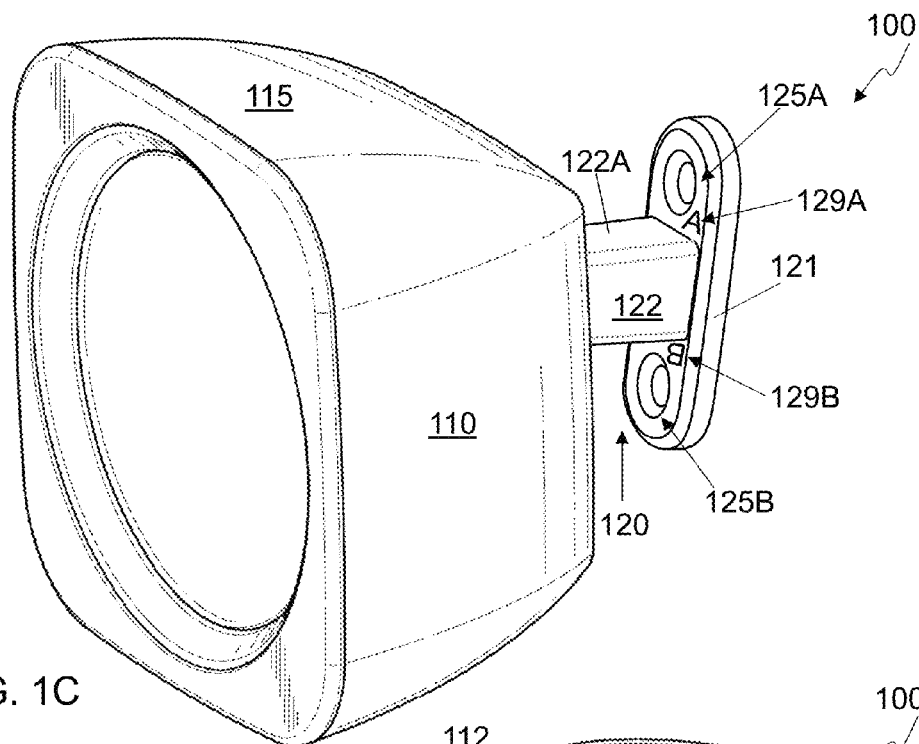
FIGS. 1C and 1D show oblique views from the front upper right and the rear lower left, respectively, of the same embodiment of the motion sensor with the mount in the first orientation as shown in FIG. 1A.
Figure 1D:
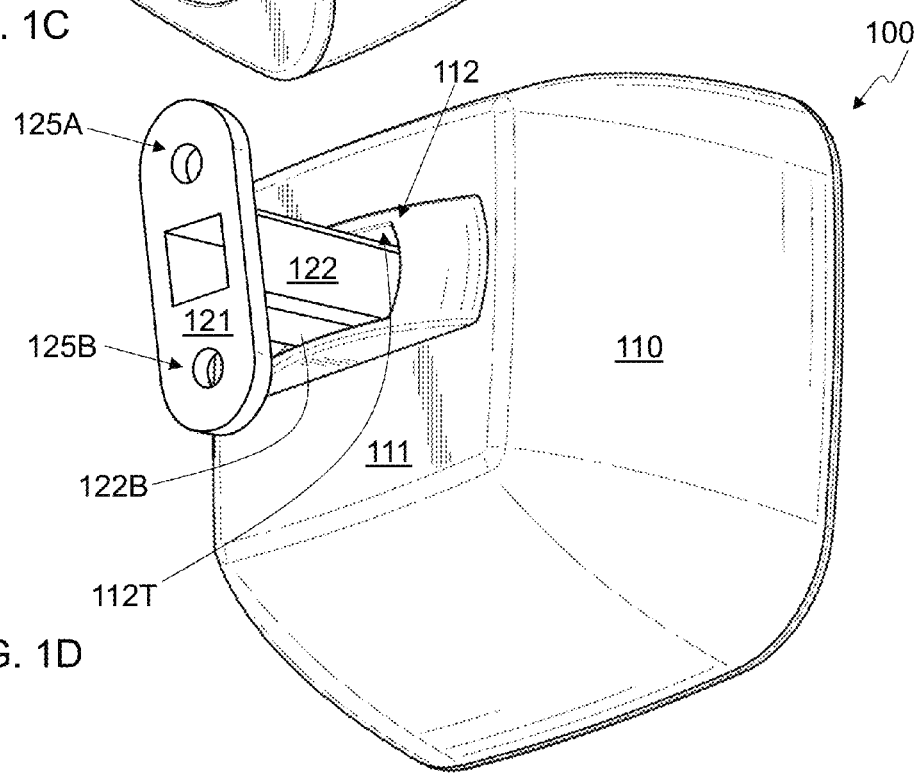

FIGS. 1A and 1B show an embodiment of a motion sensor body 110 on a mount 120, where the mount 120 is oriented in a first orientation in FIG. 1A and in a second orientation in FIG. 1B. FIGS. 1C and 1D show oblique views from the front upper right and the rear lower left, respectively, of the same embodiment of the motion sensor 100 with the mount 120 in the first orientation as shown in FIG. 1A. The motion sensor 100 includes the motion sensor body 110 and the mount 120, which is separable from the motion sensor body 110 and capable of being mounted in at least a first orientation or a second orientation. The motion sensor body 110 may include a top side 115 which is positioned at the top of the motion sensor body 110 when the motion sensor body 110 is in an upright position and configured for normal functionality of the motion sensor 100.

The motion sensor 100 has a detection pattern extending from the front of the motion sensor body 110. The shape of the motion sensor pattern varies between embodiments, but in general is bounded on the top by a functionality plane of the motion sensor body which emanates from the front of the motion sensor body 110 at an elevation angle that typically is measured as some number of degrees from horizontal when the motion sensor body 110 is positioned with its top side 115 up.

The motion sensor body 110 also includes a back side 111 that faces away from the detection area of the motion sensor 100. A socket 112 is recessed into the back side 111 of the motion sensor body 110 at an angle to the functionality plane which may be called a first angle. Any exterior portions of the socket 112 protruding from the motion sensor body 110 are considered a part of the back side 111 so even if the socket 112 does not extend past the plane of the flat part of the back side 111 into the motion sensor body 110, the socket 112 can be considered to be recessed into the back side 111 of the motion sensor body 110. The socket 112 includes a top wall 112T and a bottom wall which are substantially flat, as well as a rear-facing surface 112R which may be curved and may include a magnetic material.

The mount 120 includes a base 121 and a stem 122 which may be separate pieces or may be formed together as a single article. The base 121 is designed to be attached to a vertical wall 102 in either a first orientation as shown in FIG. 1A or a second orientation as shown in FIG. 1B. Any type of attachment can be used, according to the embodiment, including, but not limited to, glue, nails, tape, double-sided adhesive pads, magnetic attraction, or screws. In the embodiment shown, a first screw hole 125A and a second screw hole 125B in the base 121 can be used with screws to affix the mount 120 to the vertical wall 102. In the first orientation, a substantially flat first side 122A of the stem 122 is facing up and a first end 121A of the base 121 is at the top of the mount 120 as shown in FIG. 1A. In the second orientation, a substantially flat second side 122B of the stem 122 is facing up and a second end 121B of the base 121 is at the top of the mount 120 as shown in FIG. 1B. The first side 122A is the opposite side of the stem 122 from the second side 122B. In the first orientation of the mount 120, a first marking "A" 129A is upright, but in the second orientation of the mount 120, a second marking "B" 129B is upright. The markings can be any word, number and/or symbol and can be useful to the person attaching the mount 120 to the wall 102 to determine which orientation the mount 120 is in.

A proximal end of the stem 122 is attached to the base 121, and a distal end of the stem 122 is formed to fit into the socket 112 with the first side 122A and second side 122B in close proximity to the top wall 112T and bottom wall of the socket 112. In some embodiments, the distal end of the stem 122 includes a magnetic material, so the magnetic material is near the distal end of the stem 122. The stem 122 extends from the base 121 at a second angle from horizontal. The second angle can be any angle, depending on the embodiment, but in some embodiments, the second angle is between about 2 degrees and about 25 degrees, and in at least one embodiment, the second angle is about 2.5 degrees.

FIG. 1A and FIG. 1B show the motion sensor body 110 in an upright position and the stem 122 of the mount 120 inserted into the socket 112 where it may be held in place by magnetic attraction between the first magnetic material and the second magnetic material in some embodiments. In FIG. 1A with the mount in the first orientation, the angle of the motion sensor body 110 with respect to the mount 120 is set so that the functionality plane of the motion sensor body 110 is set at an angle from horizontal equal to the first angle plus the second angle. In FIG. 1B with the mount in the second orientation, the angle of the motion sensor body 110 with respect to the mount 120 is set so that the functionality plane of the motion sensor body 110 is set at an angle from horizontal equal to the first angle minus the second angle. The first angle is the angle between the functionality plane and a central axis of the socket 112 and the second angle is the angle between the central axis of the stem 122 and horizontal when the mount 120 is affixed to a vertical wall 102.

Figure 1E:
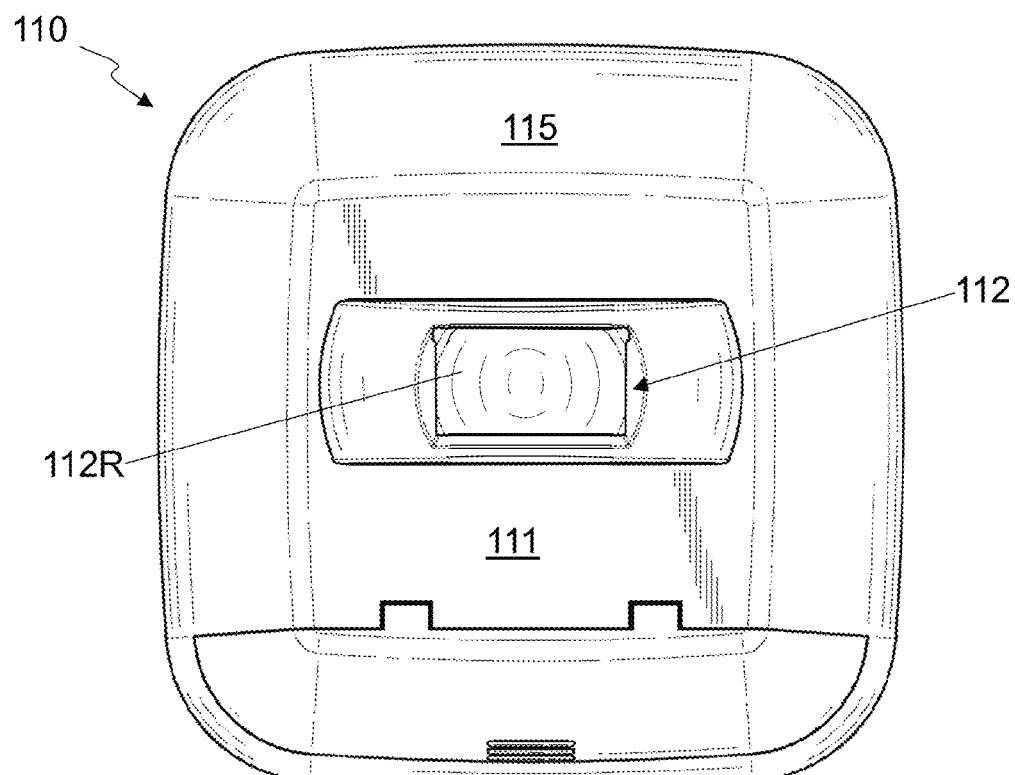
FIG. 1E shows a rear view of the embodiment of the motion sensor body of FIG. 1A-D.

FIG. 1E shows a rear view of the embodiment of the motion sensor body 110. The motion sensor body 110 has a top side 115 and a back side 111 with the socket 112 recessed into the back side 111. The socket 112 includes a curved rear-facing surface 112R between the top wall 112T and the bottom wall 112B, that in some embodiments includes a magnetic material, such as steel. In at least one embodiment, the steel magnetic material snaps into a cavity on the back side 111 of the motion sensor body 110 to form at least part of the socket 112.

In at least one embodiment, the curved rear-facing surface 112R of the socket 112 is shaped as a section of a sphere with a given diameter, and the distal end of the stem 122 is shaped as a section of a sphere with a diameter about the same as the given diameter. In another embodiment, the curved rear-facing surface 112R of the socket 112 is shaped as a section of a cylinder with a given diameter, and the distal end of the stem 122 is shaped as a section of a cylinder with a diameter about the same as the given diameter. The distal end of the stem 122 is positionable at a first location in the socket 112 to set the motion sensor body 110 at a first azimuth angle from the stem 122, and the distal end of the stem 122 is positionable at a second location in the socket 112 to set the motion sensor body 110 at a second azimuth angle from the stem 122.

Figure 2A:
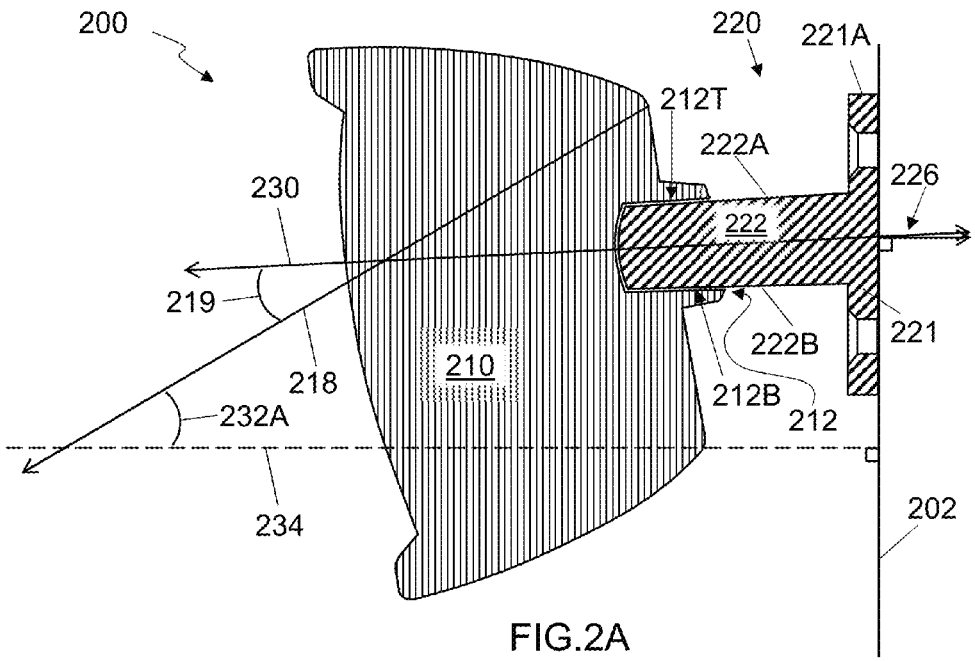
FIGS. 2A and 2B show vertical cross-sectional views of an embodiment of a security apparatus mounted with its functional plane at two different fixed angles, respectively, as determined by the orientation of the mount.
Figure 2B:
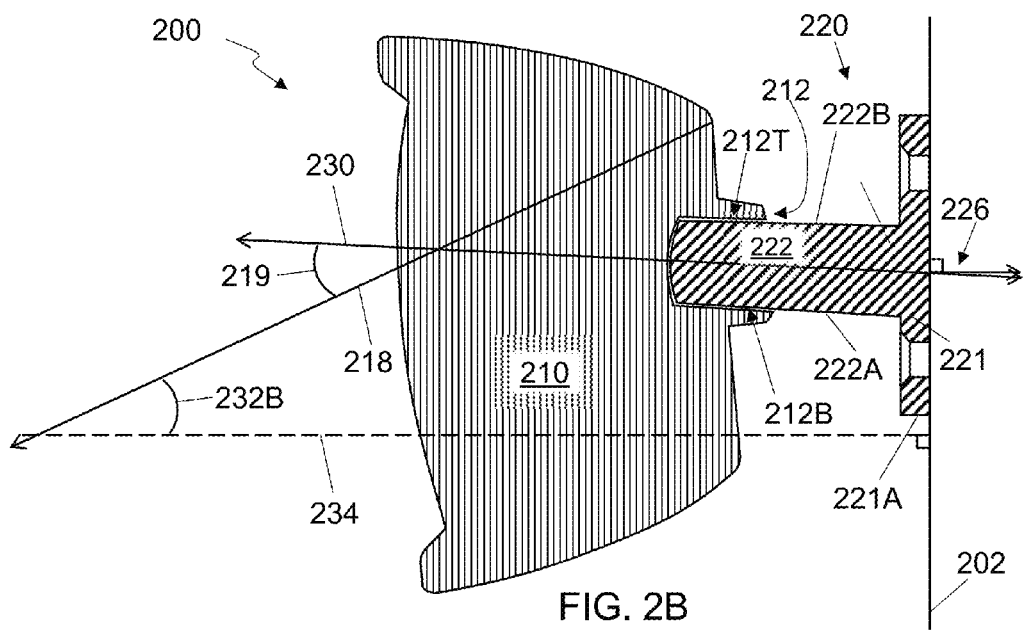

FIGS. 2A and 2B show vertical cross-sectional views of an embodiment of a security apparatus 200 mounted with its functional plane 218 at two different fixed angles, respectively, as determined by the orientation of the mount 220. The security apparatus 200 includes a sensor body 210 and a mount 220. The security apparatus 200 can be any type of device used for a security application including, but not limited to, a camera or any type, a motion sensor, a light beam interruption sensor, a chemical detector, or a sound detector.

The sensor body 210 includes a socket 212 is recessed into the sensor body 210 at a first angle 219 from a functionality plane 218 of the sensor body 210. The vector 230 shows the centerline of the socket 212 as well as the centerline of the stem 222. The socket 212 includes a first wall 212T and a second wall 212B opposite from the first wall 212T. In at least one embodiment, the first wall 212T and the second wall 212B are substantially flat, and a distance from the first wall 212T to the second wall 212B at an inside portion of the socket 212 is less than a distance from the first wall 212T to the second wall 212B at an outside portion of the socket 212 so that the socket 212 is tapered.

The functionality plane 218 extends from the sensor body 210 and may depend on the functionality of the security apparatus 200. In at least one embodiment where the security apparatus 200 is a motion sensor with a fixed detection pattern, the functionality plane 218 is a plane bounding the top of the detection pattern. In some other embodiments where the security apparatus 200 is a camera, the functionality plane is a plane bisecting a field of view of the camera or bounding an edge of the field of view. In some other embodiments where the security apparatus 200 is a sound detection device, the functionality plane is set to the plane of highest sensitivity of the sound detector. In some embodiments, the functionality plane is not tied to the actual function of the security apparatus 200, but is simply an arbitrary plane extending from the sensor body 210, such as a plane bisecting the sensor body 210.

The mount 220 includes a base 221 and a stem 222. The base 221 is adapted to be affixed at a mounting plane. In FIG. 2A and FIG. 2B the mounting plane is aligned with a vertical wall 202. A proximal end of the stem 222 is attached to the base 221, and a distal end of the stem 222 is formed to fit into the socket 212. The stem 222 has a first side 222A and a second side 222B opposite from the first side 222A. In at least one embodiment, the first side 212A and the second side 21B are substantially flat sides and the stem 212 is tapered from the distal end to the proximal end to fit into the socket 212. The centerline 230 of the stem 222 extends from the base 221 at a second angle 226 from a normal vector that is perpendicular to the mounting plane. The second angle 226 can be any angle, depending on the embodiment, but in some embodiments, the second angle 226 is between about 2° and about 25°, and in at least one embodiment, the second angle 226 is about 2.5°.

The angle 232A/B of the functionality plane 218 with respect to the normal vector 234 to the mounting plane is different depending on how the stem 222 is inserted into the socket. The mounting plane can have any orientation, but in the embodiment shown in FIG. 2A/B, the mounting plane is aligned with the vertical wall 102 making the normal vector 234 a horizontal vector in the embodiment. In FIG. 2A the stem 222 is inserted into the socket 112 with the first side 222A of the stem 222 in close proximity to the first wall 212T of the socket 212 and the second side 222B of the stem 222 in close proximity to the second wall 212B of the socket 212. A first end 221A of the base 221 may be oriented up with the base 221 attached to the vertical wall 202. With the stem 222 inserted as such, the functionality plane 218 of the sensor body 210 is set at an angle 232A from the normal vector 234 equal to the first angle 219 plus the second angle 226.

In FIG. 2B the stem 222 is inserted into the socket 112 with the first side 222A of the stem 222 in close proximity to the second wall 212B of the socket 212 and the second side 222B of the stem 222 in close proximity to the first wall 212T of the socket 212. A first end 221A of the base 221 may be oriented down with the base 221 attached to the vertical wall 202. With the stem 222 inserted as such, the functionality plane 218 of the sensor body 210 is set at an angle 232B from the normal vector 234 equal to the first angle 219 minus the second angle 226.

In some embodiments, the first angle 219 between the functionality plane 218 and the socket 212 is between 0° and 45° and the second angle is about 2.5° so that the difference between the angle of the functionality plane and the normal vector 234 to the mounting plane between the two ways of inserting the stem 222 into the socket 212 is about 5°. In at least one embodiment, the first angle 219 is about 27.5° and the second angle 226 is about 2.5° making the angle 232A with the stem 222 inserted into the socket in the first way equal to about 30° and the angle 232B with the stem 222 inserted into the socket in the second way equal to about 25°. In at least one other embodiment, the first angle 219 is about 7.5° and the second angle 226 is about 2.5° making the angle 232A with the stem 222 inserted into the socket in the first way equal to about 10° and the angle 232B with the stem 222 inserted into the socket in the second way equal to about 5°.

Figure 3:
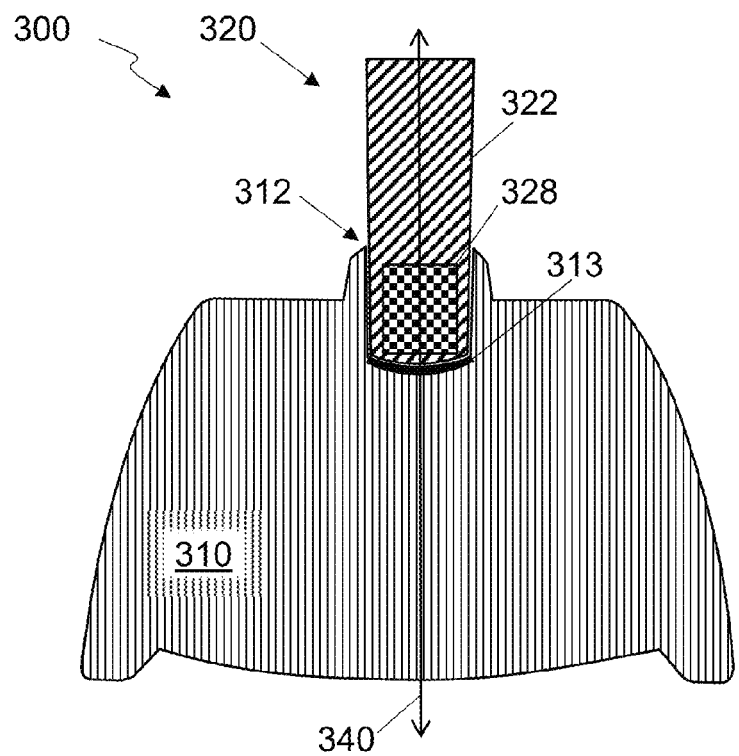
FIG. 3 shows a horizontal cross-sectional view of an embodiment of a security apparatus with a fixed azimuth angle.

FIG. 3 shows a horizontal cross-sectional view of an embodiment of a security apparatus 300 with a fixed azimuth angle. The security apparatus 300 may have a vertical cross-section that is similar to the security apparatus 200 shown in FIG. 2A/B. The security apparatus 300 includes a sensor body 310 with a socket 312 recessed into the sensor body 310 at an angle to a centerline 340 of the sensor body 310. In some embodiments, the angle between the angle of the socket 312 and the centerline 340 may be about 0° as is shown in FIG. 3.

The security apparatus 300 includes a mount 320 with a stem 322 formed to fit into the socket 312. The shape of the socket 312 and the stem 322 can be any shape, depending on the embodiment, as long as the stem 322 can be inserted into the socket 312. In at least one embodiment, the socket 312 and the stem 322 are round and the sensor body 310 can rotate around the centerline of the stem 322. In other embodiments, the stem 322 and the socket 312 have 4 flat sides so that the sensor body 310 cannot rotate around the stem 322. In some embodiments, the shape of the stem 322 and socket 312 are substantially rectangular so that the stem 322 can be inserted into the socket 312 in only two different ways as described for FIG. 2A/B above. In other embodiments, the shape of the stem 322 and socket 312 are substantially square so that the stem 322 can be inserting into the socket 312 in four different ways, at least two of which are consistent with the two different ways as described for FIG. 2A/B above. In at least one embodiment, the motion sensor body 310 is set to a substantially fixed position once the stem 322 is inserted into the socket 312 with an azimuth angle of about zero degrees from the stem 322.

In some embodiments, the socket 312 includes a first magnetic material 313, the end of the stem 322 includes a second magnetic material 328, and the stem 322 is held in the socket 312 by magnetic force. In some embodiments, the first magnetic material 313 and the second magnetic material 328 are magnets oriented to attract one another. In other embodiments, the first magnetic material 313 is a ferromagnetic material such as steel, and the second magnetic material 328 is a magnet. Any type of magnet can be used, depending on the embodiment, but in at least one embodiment, the second magnetic material 328 is a neodymium magnet. The strength of the magnet may vary between embodiments depending on the mass of the sensor body 310, distance between the first magnetic material 313 and the second magnetic material 328, the type and size of the first magnetic material 313 and the second magnetic material 328, and the application. The magnet may be chosen to allow the stem 322 to be easily pulled from the socket 312 by a person, but to still have enough force to keep the stem 322 from being easily dislodged from the socket 312 if bumped or subjected to normal building vibrations. In at least one embodiment, the magnet used for the magnetic material 328 is chosen to exert about 2 pounds of force (about 10 Newtons) between the mount 320 and the sensor body 310.

Figure 4:
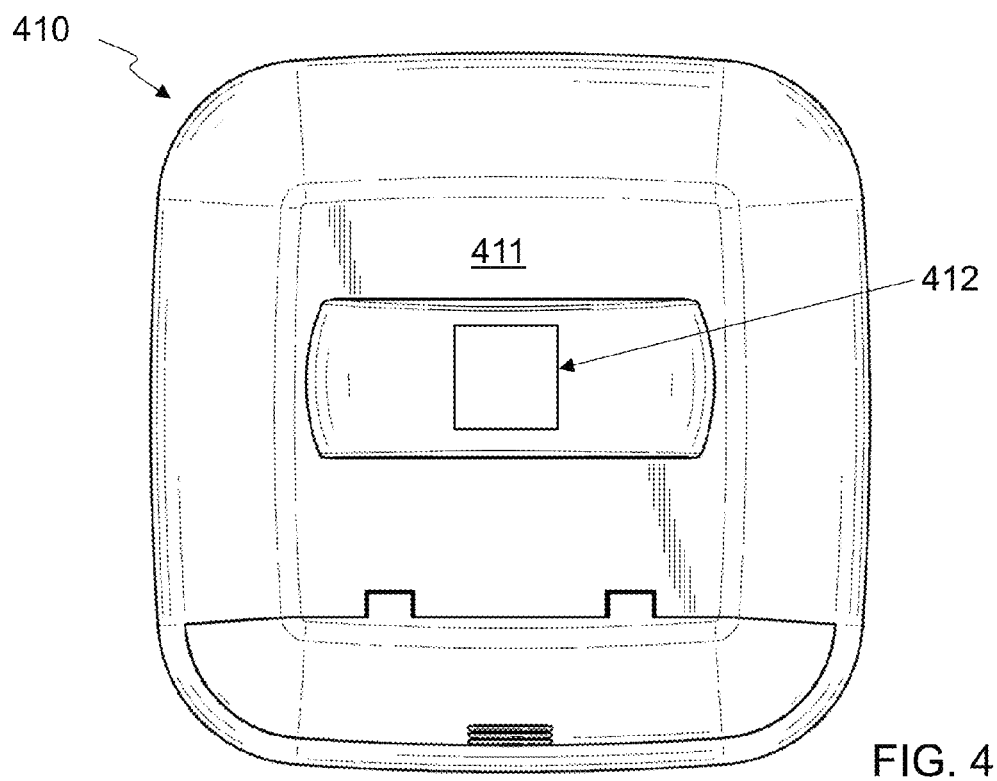
FIG. 4 shows a rear view of another embodiment of a sensor body of a security apparatus similar to the security apparatus of FIG. 1A-D but with a fixed azimuth angle.

FIG. 4 shows a rear view of another embodiment of a sensor body 410 of a security apparatus similar to the security apparatus of FIG. 1A-D but with a fixed azimuth angle. The sensor body 410 has a socket 412 recessed into a back side 411 of the sensor body 410. The socket 412 is formed to hold a stem of a mount by having 4 sides that fit in close proximity to the 4 sides of the stem so that the sensor body 410 is set to a substantially fixed position with respect to the mount when the stem is inserted into the socket 412. In at least one embodiment, the fixed position of the sensor body 410 has an azimuth angle that is about zero degrees from the stem. While in some embodiments, a stem can be inserted into the socket 412 in four different ways, at least two of the ways are consistent with the two different ways as described for FIG. 2A/B above.

Figure 5A:
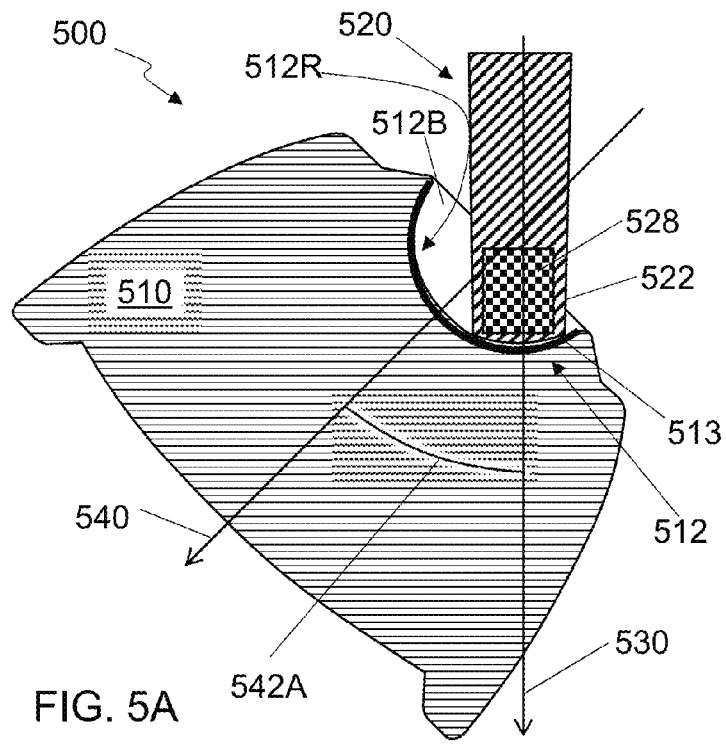
FIGS. 5A and 5B show horizontal cross-sectional views of an embodiment of a security apparatus set to two different azimuth angles.
Figure 5B:
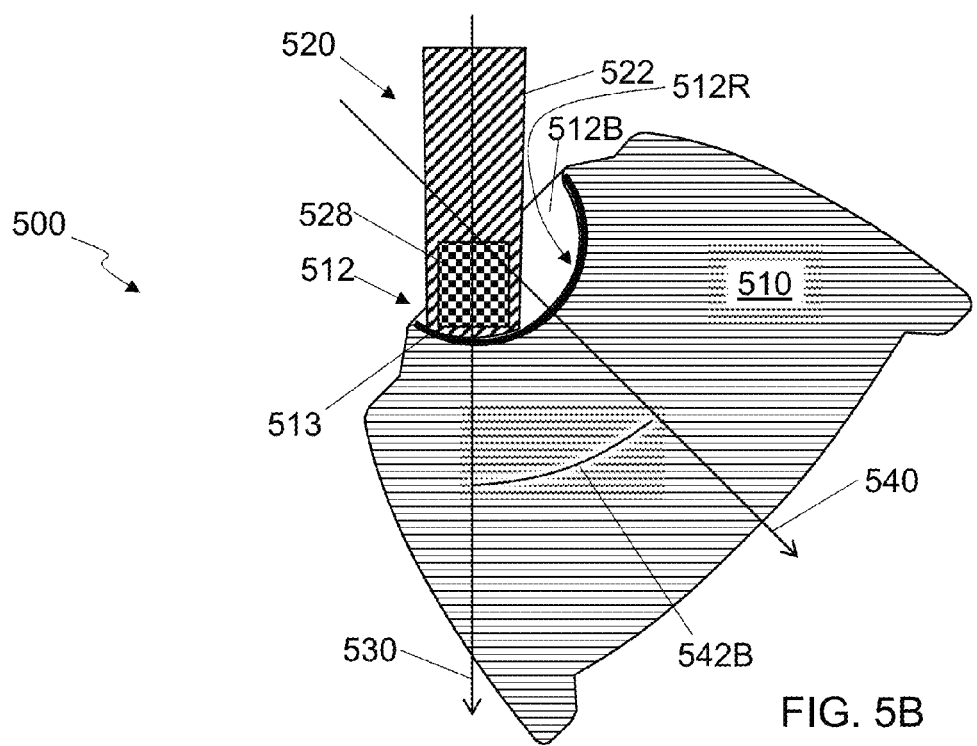

FIGS. 5A and 5B show horizontal cross-sectional views of an embodiment of a security apparatus 500 set to two different azimuth angles. The security apparatus 500 may have a vertical cross-section that is similar to the security apparatus 200 shown in FIG. 2A/B. The security apparatus 500 includes a sensor body 510 and a mount 520. The sensor body 510 includes a socket 512 recessed into back of the sensor body 510 with two substantially flat walls, a top wall (not shown) and a bottom wall 512B opposite from the top wall, and a concave rear-facing curved surface 512R between the top wall and the bottom wall. The shape of the concave rear-facing curved surface 512R may be a section of a cylinder with a given radius, a section of a sphere with a given radius, or some other shape, depending on the embodiment.

The mount 520 includes a stem 522 formed to fit between the top wall and the bottom wall 512B of the socket 512. The shape of the end of the stem 522 may be a section of a cylinder with about the same radius as the cylinder used for the curved surface 512R of the socket 512, a section of a sphere with about the same radius as the sphere used for the curved surface 512R of the socket 512, or some other shape. The end of the stem 522 is variably positionable in the socket 512 to set the sensor body 510 at a plurality of azimuth angles between a first azimuth angle 542A and a second azimuth angle 542B. In some embodiments, the sensor body 510 is pivotable on the stem 522 in a plane parallel to the stem 522 to set the azimuth angle. The azimuth angle 542A/B in at least some embodiments is measured between a centerline 530 of the stem 522 and a centerline 540 of a functional area of the sensor body 510. In at least one embodiment, the first azimuth angle 542A is equal to about 45 degrees to the right of the stem, and the second azimuth angle 542B is equal to about 45 degrees to the left of the stem.

In some embodiments, the socket 512 includes a first magnetic material 513, the end of the stem 522 includes a second magnetic material 528, and the stem 522 is held in the socket 512 by magnetic force. In some embodiments, the first magnetic material 513 is a ferromagnetic material such as steel, and the second magnetic material 528 is a magnet. Any type of magnet can be used, depending on the embodiment, but in at least one embodiment, the second magnetic material 528 is a neodymium magnet. The strength of the magnet may vary between embodiments depending on the mass of the sensor body 510, distance between the first magnetic material 513 and the second magnetic material 528, the type and size of the first magnetic material 513 and the second magnetic material 528, and the application. The magnet may be chosen to allow the stem 522 to be easily moved within the socket 512 or pulled from the socket 512 by a person, but still have enough force to keep the stem 522 from being easily moved in the socket 512 if bumped or subjected to normal building vibrations. In at least one embodiment, the magnet used for the magnetic material 528 is chosen to exert about 5 pounds of force (about 20 newtons) between the mount 520 and the sensor body 510. The force used for this embodiment may be higher than the force used for the embodiment of FIG. 3A/B because the embodiment of FIG. 3A/B holds the stem 322 on all four sides and allows for less movement of the stem than the embodiment of FIG. 5A/B which only holds the stem 522 on two sides.

Figure 6A:
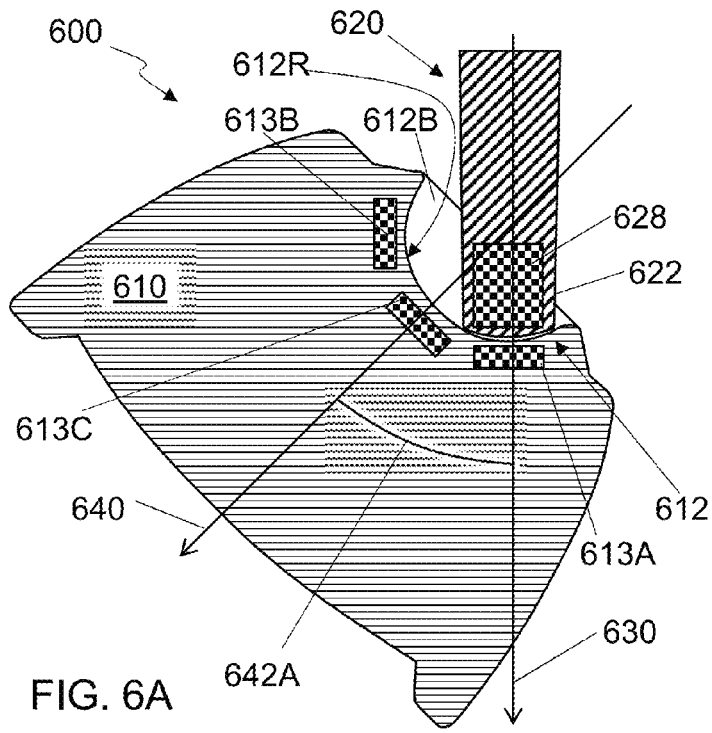
FIGS. 6A and 6B show horizontal cross-sectional views of an alternative embodiment of a security apparatus set to two different azimuth angles.
Figure 6B:
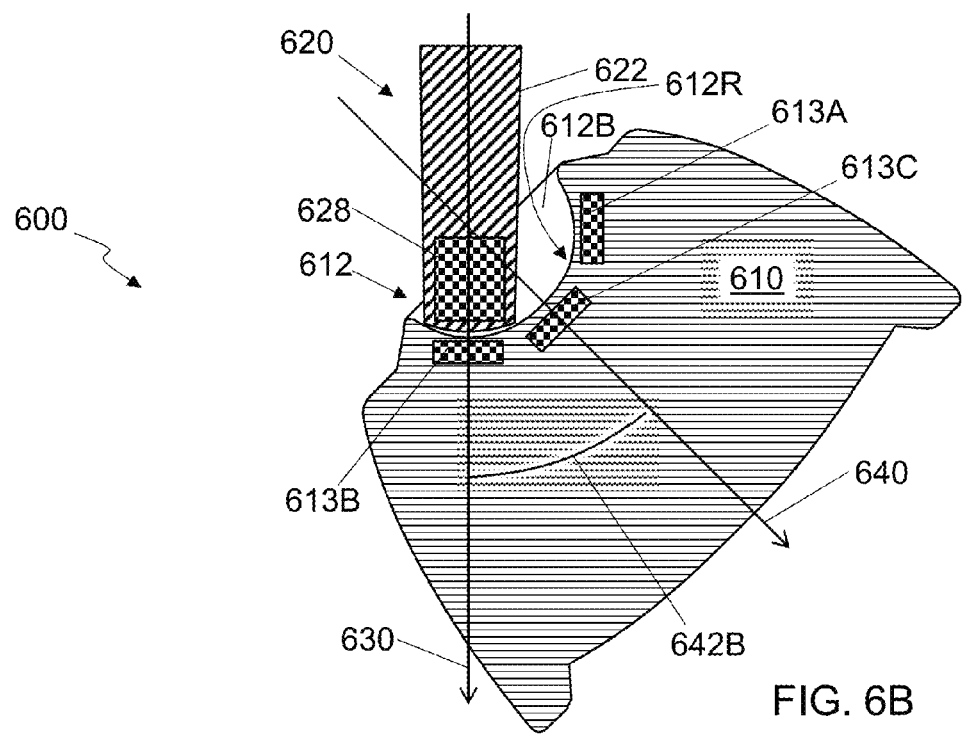

FIGS. 6A and 6B show horizontal cross-sectional views of an alternative embodiment of a security apparatus 600 set to two different azimuth angles. The security apparatus 600 may have a vertical cross-section that is similar to the security apparatus 200 shown in FIG. 2A/B. The security apparatus 600 includes a sensor body 610 and a mount 620. The sensor body 610 includes a socket 612 recessed into back of the sensor body 610 with two substantially flat walls, a top wall (not shown) and a bottom wall 612B opposite from the top wall, and a concave rear-facing curved surface 612R between the top wall and the bottom wall. In embodiments, the concave rear-facing curved surface 612R includes two or more magnets placed near the socket with a magnetic pole facing into the socket.

The mount 620 includes a stem 622 formed to fit between the top wall and the bottom wall 612B of the socket 612. The end of the stem 622 is variably positionable in the socket 612 to set the sensor body 610 at a plurality of azimuth angles. The end of the stem 622 includes a magnetic material 628 which in some embodiments is a magnet with an opposite magnetic pole facing the end of the stem. The azimuth angle 642A/B in at least some embodiments is measured between a centerline 630 of the stem 622 and a centerline 640 of a functional area of the sensor body 610.

The security apparatus 600 includes a first alignment mechanism to position the end of the stem 622 at a first location in the socket 612 to set the sensor body 610 to a first azimuth angle 642A of about 45 degrees The first alignment mechanism includes a first magnet 613A near the first location in the socket 612 to attract the magnetic material 628 in the stem.

The security apparatus 600 includes a second alignment mechanism to position the end of the stem 622 at a second location in the socket 612 to set the sensor body 610 to a second azimuth angle 642B of about –45 degrees. The second alignment mechanism includes a second magnet 613B near the second location in the socket 612 to attract the magnetic material 628 in the stem.

The security apparatus 600 includes a third alignment mechanism to position the end of the stem 622 at a third location in the socket 612 to set the sensor body 610 to a third azimuth angle of about 0 degrees The third alignment mechanism includes a third magnet 613C near the third location in the socket 612 to attract the magnetic material 628 in the stem.

In at least one embodiment, the magnetic material 628 includes a magnet with its north pole facing the socket. In those embodiments, the first magnet 613A is placed near the socket 612 with its south pole facing into the socket 612, the second magnet 613B is placed near the socket 612 with its south pole facing into the socket 612, and the third magnet 613C is placed near the socket 612 with its south pole facing into the socket 612

In other embodiments, end of the stem is held in the socket by friction between first and second walls of the socket and first and second sides of the stem, or a snap-in mechanism. FIG. 7A shows a vertical cross-sectional view of an embodiment of a security apparatus 700 with the stem 722 of the mount 720 held in the socket 712 by a snap-in mechanism. The security apparatus 700 includes a sensor body 710 with the socket 712 recessed into the back of 711 the sensor body 710. A portion of the back of the sensor body 711 including the socket 712 is shown in FIG. 7B. The socket 712 includes a slot 715 in the rear surface 712R of the socket 712 backed by a cavity 716. In some embodiments, the slot 715 includes one or more detents, such as the first detent 717A, the second detent 717B, and the third detent 717C which may be wide points in the slot 715. The stem 722 has a protrusion extending from the end of the stem 722 that includes a head 726 and a neck 724. The head 726 is adapted to be pushed through the slot 715 into the cavity 716 with the neck 724 extending through the slot 715. The head 726 is further adapted to not easily pull back through the slot 715, which may be accomplished by an arrow-head shape to the head 726. In some embodiment, the neck 724 may be sized to fit tightly in the slot 715 so that there is a resistance to move the neck 724 out of one of the detents 717A-C. In some embodiments, the head 726 and neck 724 may have a slot cut through them to allow them to more easily contract and expand.

The sensor body 710 can then be positioned at various azimuth angles by sliding the neck 724 through the slot 715. An alignment mechanism, such as one of the detents 717A-C, may be used to position the end of the stem 722 in a particular location in the socket 712 to set a particular azimuth angle. In other embodiments the alignment mechanism is a sub-socket, or deeper portion, the rear facing surface 712R of the socket 712 to hold the end of the stem 722, a detent on one of the walls of the socket 712, or a visible marking on the sensor body 710. In the embodiment shown, the first detent 717A may be used to position the stem 722 at a first location in the socket 712 to set a first azimuth angle, the second detent 717B may be used to position the stem 722 at a second location in the socket 712 to set a second azimuth angle, and the third detent 717C may be used to position the stem 722 at a third location in the socket 712 to set a third azimuth angle of about 0 degrees. The stem 722 may also be positionable between the first location in the socket 712 and the second location in the socket 712 to vary the azimuth angle.

Figure 8:
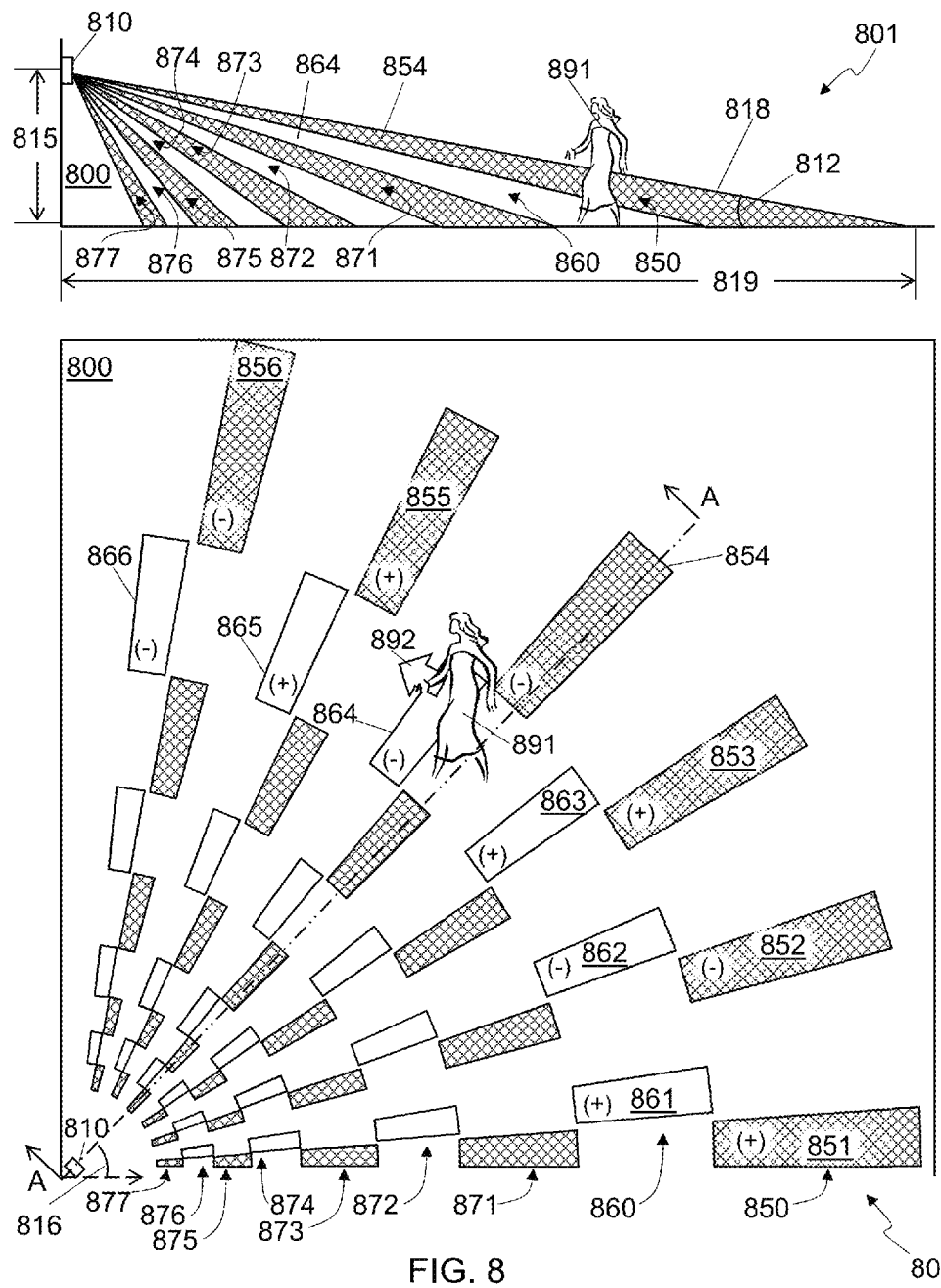
FIG. 8 shows a side view and a top view of a detection pattern for an embodiment of a motion sensor.

FIG. 8 shows a side view 801 and a top view 802, respectively, of detection pattern for an embodiment of a motion sensor 810. The detection pattern can also be thought us as monitored volumes of space by the motion sensor 810 in a room 800. Side view 801 shows a vertical planar cross-section of the room 800 as shown by the cross-section line A:A in top view 802. Looking first at the side view 801, the motion sensor 810 is mounted on a wall of the room 800 at a height 815. The detection pattern of the motion sensor 810 is bounded on its top by functionality plane 818 which extends from the motion sensor 810 at an election of an angle 812 below horizontal so that the functionality plane 818 also forms the angle 812 with the floor at a distance 819 from the motion sensor 810. The motion sensor 810 is mounted at an azimuth angle 816 to set the coverage area of the detection pattern as shown in the top view 802.

The motion sensor 810 monitors several tiers, or rows, of monitored volumes that project from the motion sensor 810 at different elevations. In the side view 801, the monitored volumes without hatch lines, such as monitored volume 864, are behind the cross-sectional plane A:A, and the monitored volumes with the hatch lines, such as monitored volume 854, are intersected by the cross-sectional plane A:A. The various tiers intersect the floor of the room 800 in arcs, as shown in the top view 802. The locations where the even numbered tiers hit the floor are shown without hatch lines, and the locations where the odd numbered tiers hit the floor are shown with hatch lines in the top view 802.

Looking now at both the side view 801 and the top view 802 together, the highest tier 850, which includes the monitored volume 854, is an odd numbered tier and includes monitored volumes 851-856. The next even numbered tier 860 includes monitored volumes 861-866. Additional alternating odd tiers 871, 873, 875, 877 and even tiers 872, 874, 876 each include a set of monitored volumes. The number of tiers and number of monitored volumes per tier shown in FIG. 8 are shown as an example, but any detection pattern can be used depending on the embodiment.

A human 891 is shown in FIG. 8 moving through the room 800. As the human 891 moves through the room 800 in the direction 892, she passes through multiple monitored volumes of multiple tiers. At her initial location, the human 891 is intersecting monitored volume 854 of tier 850. Infrared radiation generated by the warmth of her body is directed from the monitored volume 854 onto one or more detector elements in the motion sensor 810. As the human 891 moves in the direction 892, she moves out of the monitored volume 854 and into monitored volume 864, followed by moving from monitored volume 864 into monitored volume 855 and so on. The motion sensor 810 detects that the infrared radiation has moved between monitored volumes and can use that information to indicate that motion has been detected. The motion sensor 810 can then generate one or more of an audible indication, such as a siren or warning voice, a visual indication, such as turning on a light, or a actuating a strobe light or rotating light, generating an indication on a wired circuit, such as closing a switch or sending an ethernet message, and/or sending a radio frequency message, such as a message sent over a Wi-Fi (IEEE 800.11) network or Zigbee (IEEE 802.15) network.

Note that a combination of the elevation angle 812 of the functionality plane 818 of the motion sensor 810 and the mounting height 815 of the motion sensor 810 determine the distance 819 from the motion sensor 810 that the detection pattern extends. So if a constant distance 819 for the detection pattern is desired, if the height 815 changes, the elevation angle 812 of the functionality plane 818 needs to change to keep the distance 819 constant. If motion sensor 810 has a body and a mount as shown in FIG. 1A-E or FIG. 2A/B, the orientation of the mount may be changed as the mounting height 815 is changed to keep a constant distance 819.

In one example, the functionality plane extends 818 from the sensor body at an angle of about 27.5°. A mount is provided with a stem that protrudes from the base at an angle of about 2.5° from horizontal if the mount is attached to a vertical wall. So if the mount is attached to the vertical wall in the first orientation, the functionality plane 818 extends from the motion sensor at about 27.5°+2.5°=30°. If the mount is attached to the wall in the second orientation, the functionality plane 818 extends from the motion sensor at about 27.5°−2.5°=25°. So if it is desired that the distance 819 for the detection pattern to extend from the motion sensor 810 is about 16 feet (about 5 meters), a mounting height of about 9' 4" (about 2.8 meters) would extend the detection pattern to about 16 feet if the mount is attached to the wall in the first position, and a mounting height of about 7' 6" (about 2.3 meters) would extend the detection pattern to about 16 feet if the mount is attached to the wall in the second position. This can be shown by using a trigonometric formula to solve for the mounting height based on the distance 819 and the elevation angle 812 using the formula:

$$h = \tan(\alpha) \times d,$$

where α is the elevation angle 812, d is the distance 819, and h is the mounting height 815.

This shows an example of selecting an orientation to use to affix the mount to the vertical wall based on a mounting height, a target coverage area, and the detection pattern of the motion sensor body. Once the orientation is selected, the mount can be affixed to the vertical wall in the selected orientation at the mounting height and the stem of the mount inserted into the socket with the motion sensor body in an upright position. In some embodiments, an azimuth angle 816 for the motion sensor body is also determined based on the target coverage area and the detection pattern of the motion sensor body. To set the azimuth angle, the end of the stem is inserted into the socket at an appropriate location in the socket to set the motion sensor body at the determined azimuth angle 816.

Figures 9A, 9B:
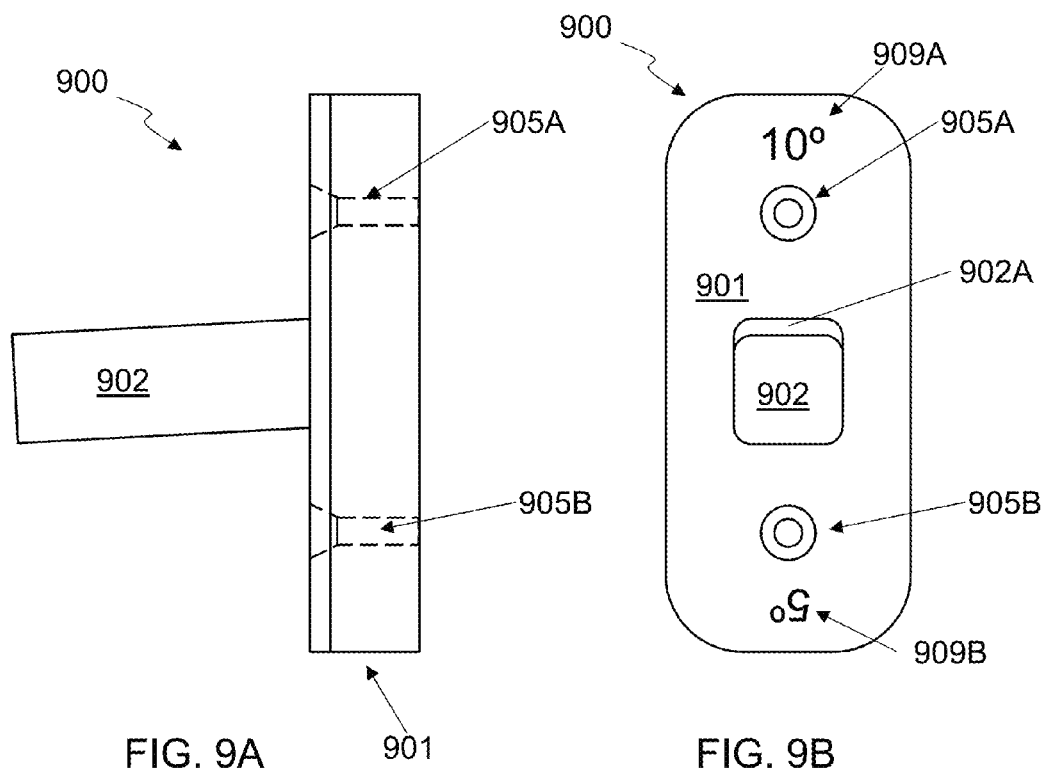
FIG. 9A-C show a three view orthographic projection of an embodiment of a mount suitable for embodiments.
Figure 9C:
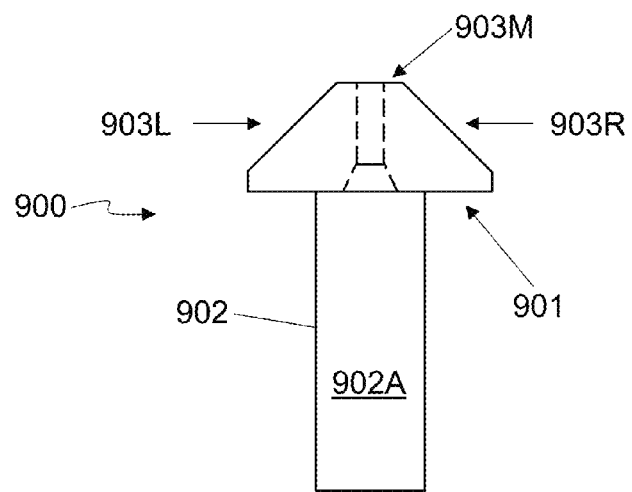

FIG. 9A-C show a three view orthographic projection of an embodiment of a mount 900 suitable for embodiments of a security apparatus. FIG. 9A shows a side view, FIG. 9B shows a front view, and FIG. 9C shows a top view of the mount 900 in the first orientation. The mount includes a base 901 and a stem 902 extending from the base 901. The base 901 of this embodiment is configured to be attached to either a flat surface or an interior corner of two surfaces where the surfaces may be vertical walls. The base 901 includes two screw holes 905A, 905B which can be used to attach the base 901 to either the flat surface or the interior corner. Other embodiments may use other mechanisms to attach the base 901 to the surface including, but not limited to, glue, nails, rivets, tape, double-sided sticky pads, magnetic attraction, or any other attachment mechanism. If the base 901 is attached to a flat surface, the back surface 903M of the base 901 is held flush against the wall that is coincident with the mounting plane of the mount 900. If the base 901 is attached to an interior corner of two surfaces that meet in the mounting plane of the mount with the normal vector of the mounting plane bisecting the interior corner, the left angled surface 903L is held against one of the surfaces of the interior corner, and the right angled surface 903R is held against the other surface of the interior corner.

The mount 900 is shown in the first orientation with the stem 902 sloping down, or extending from the base at an angle below a normal vector to the mounting plane. In the first orientation, the first side 902A of the stem 902 is facing up, and the first screw hole 905A is above the stem 902. A first marking 909A on the mount 900 is positioned to be upright if the mount 900 is affixed to a vertical surface in the first orientation. The mount 900 can also be attached to the vertical surface in a second orientation. In the second orientation, the first side 902A of the stem 902 is facing down, a second side of the stem 902 opposite from the first side 902A is facing up, and the second screw hole 905B is above the stem 902. A second marking 909B on the mount 900 is positioned to be upright if the mount is affixed to the vertical surface in a second orientation with the second side of the stem facing up. The first marking 909A and the second marking 909B can be any type of marking but in at least one embodiment, the markings 909A/B indicate an elevation angle for the security apparatus if the mount is affixed to the wall.

FIG. 9D shows an embodiment of a cover 980 to hide the base 901 and mounting screws of the mount 900 of FIG. 9A-C if the mount 900 is affixed to a flat surface. The cover 980 slides over the mount 900 with the stem 902 protruding through the hole 982. In some embodiments, the cover 980 may snap into place over the base 901 to keep the cover 980 in place. The sides of the cover, such as the right side 983R, may cover the gap created by the angled surfaces 903L/R of the base 901.

FIG. 9E shows an embodiment of a cover 990 to hide the base 901 and mounting screws of a mount 900 of FIG. 9A-C if the mount 900 is affixed in an interior corner. The cover 990 slides over the mount 900 with the stem 902 protruding through the hole 992. In some embodiments, the cover 990 may snap into place over the base 901 to keep the cover 990 in place. The right side 993R and left side 993L of the cover 990 fit into the corner where the mount 900 is attached.

Figure 10:
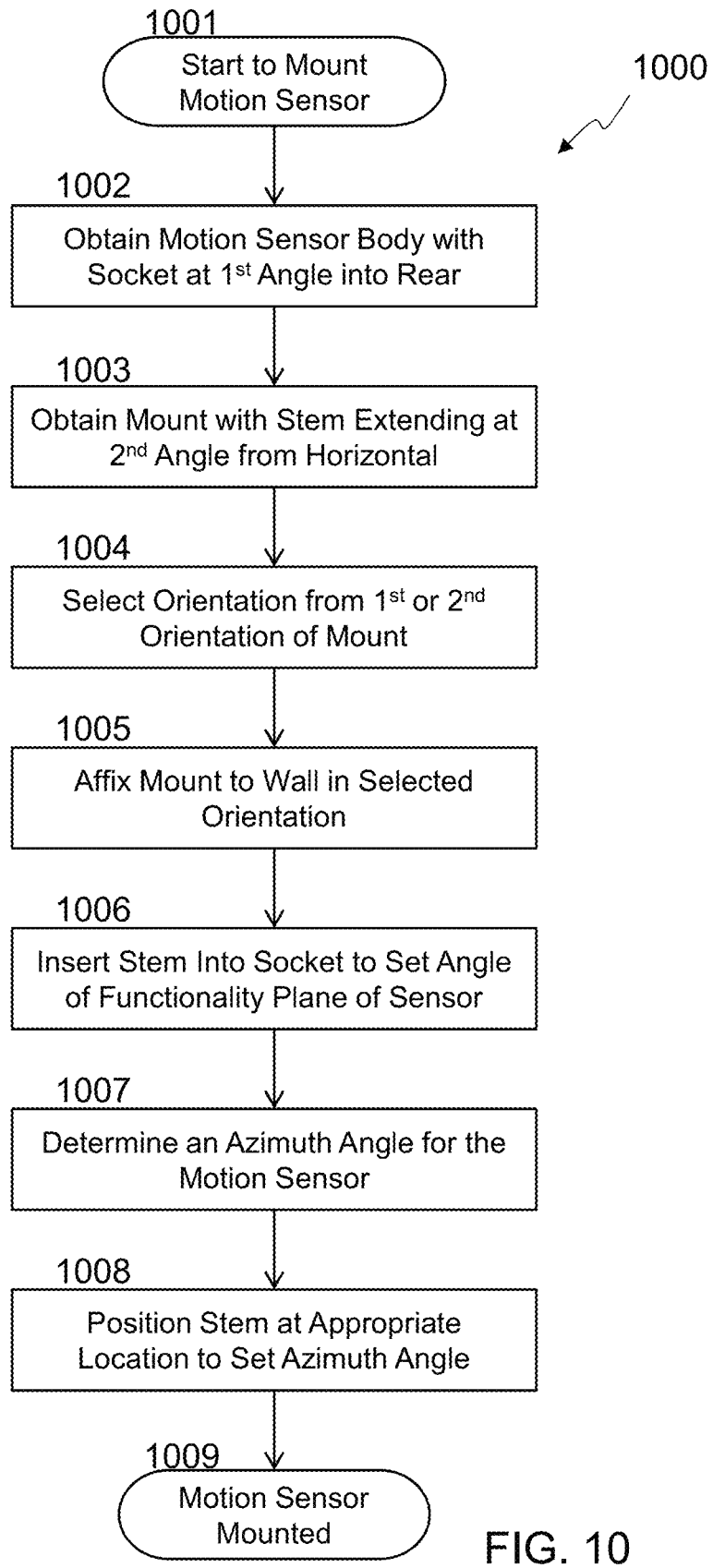
FIG. 10 shows a flowchart of an embodiment of a method of mounting a motion sensor.

FIG. 10 shows a flowchart 1000 of an embodiment of a method of mounting a motion sensor. The method starts to mount the motion sensor at block 1001 and a motion sensor body is obtained at block 1002. The motion sensor body includes a socket and a detection pattern with a functionality plane bounding the top of the detection pattern. The socket is recessed into a back side of the motion sensor body at a first angle from the functionality plane of the motion sensor body.

The flowchart 1000 continues at block 1003 with obtaining a mount. The mount includes a base and a stem. The base is adapted to be affixed to a vertical wall in either a first orientation or a second orientation. A proximal end of the stem is attached to the base, and a distal end of the stem is formed to fit into the socket of the motion sensor body. The stem extends from the base at a second angle from horizontal.

An orientation is selected at block 1004 to use to affix the mount to the vertical wall, from either the first orientation or the second orientation, based on a mounting height, a target coverage area, and the detection pattern of the motion sensor body. The mount is affixed on the vertical wall at block 1005 in the selected orientation at the mounting height. At block 1006 the stem is inserted into the socket with the motion sensor body in an upright position to situate the motion sensor body on the mount. Once the stem is inserted into the socket on the motion sensor body, the functionality plane of the motion sensor body is set at an angle from horizontal equal to the first angle plus the second angle if the mount is affixed to the vertical wall in the first orientation, and an angle from horizontal equal to the first angle minus the second angle if the mount is affixed to the vertical wall in the second orientation.

In some embodiments, the method also includes setting an azimuth angle. In such embodiments, the flowchart 1000 includes optional block 1007 to determine an azimuth angle for the motion sensor body based on the target coverage area and the detection pattern of the motion sensor body, and positioning the end of the stem at an appropriate location in the socket at optional block 1008 to set the motion sensor body at the determined azimuth angle. The method concludes at block 1009.

Examples of various embodiments are described in the following paragraphs:

An example motion sensor includes a motion sensor body that includes a socket and a detection pattern with a functionality plane bounding the top of the detection pattern, wherein the socket is recessed into a back side of the motion sensor body at a first angle from the functionality plane of the motion sensor body and the socket comprises a substantially flat top wall, a substantially flat bottom wall opposite from the top wall, and a rear-facing surface comprising a first magnetic material. The example motion sensor also includes a mount that includes a base and a stem, the base adapted to be affixed to a vertical wall in either a first orientation with a substantially flat first side of the stem facing up, or a second orientation with a substantially flat second side of the stem facing up, a proximal end of the stem attached to the base, and a distal end of the stem comprising a second magnetic material and formed to fit into the socket with the first and second sides in close proximity to the top and bottom walls of the socket, wherein the stem extends from the base at a second angle from horizontal and the first side is the opposite side of the stem from the second side. With the example motion sensor body in an upright position and the stem of the mount inserted into the socket and held in place by magnetic attraction between the first magnetic material and the second magnetic material, the functionality plane of the motion sensor body is set at an angle from horizontal equal to the first angle plus the second angle if the mount is affixed to the vertical wall in the first orientation, and the functionality plane of the motion sensor body is set at an angle from horizontal equal to the first angle minus the second angle if the mount is affixed to the vertical wall in the second orientation. In some example motion sensors, the motion sensor body is set to a substantially fixed position with an azimuth angle of about zero degrees from the stem when the stem is inserted into the socket. In some example motion sensors, the second angle is about 2.5 degrees. Some example motion also include a first marking on the mount positioned to be upright if the mount is affixed to the vertical wall in the first orientation, and a second marking on the mount positioned to be upright if the mount is affixed to the vertical wall in the second orientation. In some example motion sensors, the base is adapted to be affixed at an interior corner of the vertical wall. In some example motion sensors, the socket further also includes a concave rear-facing curved surface between the top wall and the bottom wall, and the distal end of the stem is variably positionable in the socket to set the motion sensor body at a plurality of azimuth angles between a first azimuth angle and a second azimuth angle. Some example motion sensors also include a first alignment mechanism to position the distal end of the stem at a first location in the socket to set the motion sensor body to the first azimuth angle of about 45 degrees, a second alignment mechanism to position the distal end of the stem at a second location in the socket to set the motion sensor body to the second azimuth angle of about −45 degrees, and a third alignment mechanism to position the distal end of the stem at a third location in the socket to set the motion sensor body to a third azimuth angle of about 0 degrees. In some example motion sensors, the first magnetic material comprises steel shaped to form the rear-facing surface of the socket, and the second magnetic material comprises a magnet. Any combination of elements described in this paragraph may be used in various embodiments.

An example method of mounting a motion sensor includes obtaining a motion sensor body comprising a socket and a detection pattern with a functionality plane bounding the top of the detection pattern, wherein the socket is recessed into a back side of the motion sensor body at a first angle from the functionality plane of the motion sensor body, and obtaining a mount comprising a base and a stem, the base adapted to be affixed to a vertical wall in either a first orientation or a second orientation, a proximal end of the stem attached to the base, and a distal end of the stem formed to fit into the socket, wherein the stem extends from the base at a second angle from horizontal, The example method also includes selecting an orientation from the first orientation or the second orientation to use to affix the mount to the vertical wall based on a mounting height, a target coverage area, and the detection pattern of the motion sensor body, affixing the mount on the vertical wall in the selected orientation at the mounting height, and inserting the stem into the socket with the motion sensor body in an upright position to situate the motion sensor body on the mount. In the example motion sensor, the functionality plane of the motion sensor body is set at an angle from horizontal equal to the first angle plus the second angle if the mount is affixed to the vertical wall in the first orientation, and the functionality plane of the motion sensor body is set at an angle from horizontal equal to the first angle minus the second angle if the mount is affixed to the vertical wall in the second orientation. Some example methods also include determining an azimuth angle for the motion sensor body based on the target coverage area and the detection pattern of the motion sensor body, and positioning the end of the stem at an appropriate location in the socket to set the motion sensor body at the determined azimuth angle. Any combination of elements described in this paragraph may be used in various embodiments.

An example security apparatus includes a sensor body comprising a socket, wherein the socket is recessed into the sensor body at a first angle from a functionality plane of the sensor body, the socket comprising a first wall and a second wall opposite from the first wall, and a mount comprising a base and a stem, the base adapted to be affixed at a mounting plane, a proximal end of the stem attached to the base, and a distal end of the stem formed to fit into the socket, wherein the stem extends from the base at a second angle from a normal vector that is perpendicular to the mounting plane and the stem comprises a first side and a second side opposite from the first side. In the example security apparatus, the functionality plane of the sensor body is set at an angle from the normal vector equal to the first angle plus the second angle if the stem is inserted into the socket with the first side of the stem in close proximity to the first wall of the socket, and the functionality plane of the sensor body is set at an angle from the normal vector equal to the first angle minus the second angle if the stem is inserted into the socket with the first side of the stem in close proximity to the second wall of the socket. Some example security apparatuses also include a first marking on the mount positioned to be upright if the mount is affixed to a vertical surface in a first orientation with the first side of the stem facing up, and a second marking on the mount positioned to be upright if the mount is affixed to the vertical surface in a second orientation with the second side of the stem facing up. In some example security apparatuses, the base is adapted to be affixed at an interior corner of two surfaces intersecting in the mounting plane. Some example security apparatuses also include comprising a cover to hide the base of the mount. In some example security apparatuses, the first wall and the second wall are substantially flat, and a distance from the first wall to the second wall at an inside portion of the socket is less than a distance from the first wall to the second wall at an outside portion of the socket, and the first side and the second side are substantially flat sides and the stem is tapered from the distal end to the proximal end to fit into the socket. In some example security apparatuses, the sensor body is set to a substantially fixed position with respect to the mount when the stem is inserted into the socket. In some example security apparatuses, the fixed position of the sensor body has an azimuth angle that is about zero degrees from the stem. In some example security apparatuses, the sensor body is pivotable on the stem in a plane parallel to the stem. In some example security apparatuses, the first wall and the second wall of the socket are substantially flat, and the socket further comprises a curved rear-facing surface between the first wall and the second wall, and the first side and second side of the stem are substantially flat and are formed to fit into the socket in close proximity to the first and second wall of the socket when the distal end of the stem is inserted into the socket. In some example security apparatuses, the distal end of the stem is positionable at a first location in the socket to set the sensor body at a first azimuth angle from the stem, and the distal end of the stem is positionable at a second location in the socket to set the sensor body at a second azimuth angle from the stem. In some example security apparatuses, the curved rear-facing surface of the socket is shaped as a section of a cylinder with a given diameter, and the distal end of the stem is shaped as a section of a cylinder with a diameter about the same as the given diameter. In some example security apparatuses, the curved rear-facing surface of the socket is shaped as a section of a sphere with a given diameter, and the distal end of the stem is shaped as a section of a sphere with a diameter about the same as the given diameter. In some example security apparatuses, the distal end of the stem is variably positionable in the socket to set the sensor body at a plurality of azimuth angles between the first azimuth angle and the second azimuth angle. In some example security apparatuses, the first azimuth angle is equal to about 45 degrees to the right of the stem, and the second azimuth angle is equal to about 45 degrees to the left of the stem. Some example security apparatuses also include a first alignment mechanism to position the distal end of the stem in the first location in the socket, a second alignment mechanism to position the distal end of the stem in the second location in the socket, and a third alignment mechanism to position the distal end of the stem in a third location in the socket to set the sensor body at an azimuth angle of about 0 degrees from the stem. In some example security apparatuses, an alignment mechanism is used to position the distal end of the stem in the first location in the socket. In some example security apparatuses, the alignment mechanism comprises a sub-socket or a detent in the rear-facing surface of the socket, a detent on the first or second wall of the socket, or a visible marking on the sensor body. In some example security apparatuses, security apparatus also includes a first magnet positioned near the distal end of the stem with a first magnetic pole facing the distal end of the stem, a second magnet placed near the first location in the socket with a magnetic pole opposite of the first magnetic pole facing into the socket, and a third magnet placed near the second location in the socket with a magnetic pole opposite of the first magnetic pole facing into the socket. In some example security apparatuses, the distal end of the stem is held in the socket by friction between first and second walls of the socket and first and second sides of the stem, or a snap-in mechanism. In some example security apparatuses, the socket comprises a first magnetic material, and the distal end of the stem comprises a second magnetic material, and the distal end of the stem is held in the socket by magnetic force. In some example security apparatuses, the first magnetic material comprises steel, and the second magnetic material comprises a magnet. In some example security apparatuses, the steel magnetic material snaps into a cavity on the back of the sensor body to form at least part of the socket. In some example security apparatuses, the magnet includes neodymium. In some example security apparatuses, the first magnetic material includes one or more magnets placed near the socket with a magnetic pole facing into the socket, and the second magnetic material includes a magnet with an opposite magnetic pole facing the distal end of the stem. In some example security apparatuses, the sensor body comprises a motion sensor with a fixed detection pattern. Any combination of elements described in this paragraph may be used in various embodiments.

As used in this specification and the appended claims, the singular forms "a", "an", and "the" include plural referents unless the content clearly dictates otherwise. Thus, for example, reference to an element described as "a monitored volume" may refer to a single monitored volume, two monitored volumes, or any other number of monitored volumes. As used in this specification and the appended claims, the term "or" is generally employed in its sense including "and/or" unless the content clearly dictates otherwise. As used herein, the term "coupled" includes direct and indirect connections. Moreover, where first and second devices are coupled, intervening devices including active devices may be located there between. Unless otherwise indicated, all numbers expressing quantities of elements, percentages, and so forth used in the specification and claims are to be understood as being modified in all instances by the term "about." Interpretation of the term "about" is context specific, but in the absence of other indications, should generally be interpreted as ±5% of the modified quantity, measurement, or distance. The recitation of numerical ranges by endpoints includes all numbers subsumed within that range (e.g. 1 to 5 includes 1, 2.78, 3.33, and 5). Any element in a claim that does not explicitly state "means for" performing a specified function, or "step for" performing a specified function, is not to be interpreted as a "means" or "step" clause as specified in 35 U.S.C. §112(f).

The description of the various embodiments provided above is illustrative in nature and is not intended to limit the invention, its application, or uses. Thus, different variations beyond those described herein are intended to be within the scope of the embodiments of the present invention. Such variations are not to be regarded as a departure from the intended scope of the present invention. As such, the breadth and scope of the present invention should not be limited by the above-described exemplary embodiments, but should be defined only in accordance with the following claims and equivalents thereof.

What is claimed is:

1. A motion sensor comprising:
    a motion sensor body comprising a socket and a detection pattern with a functionality plane bounding a top of the detection pattern, wherein the socket is recessed into a back side of the motion sensor body at a first angle from the functionality plane of the motion sensor body and the socket comprises a substantially flat top wall, a substantially flat bottom wall opposite from the top wall, and a rear-facing surface comprising a first magnetic material;
    a mount comprising a base and a stem, the base adapted to be affixed to a vertical wall in either a first orientation with a substantially flat first side of the stem facing up, or a second orientation with a substantially flat second side of the stem facing up, a proximal end of the stem attached to the base, and a distal end of the stem comprising a second magnetic material and formed to fit into the socket with the first and second sides in close proximity to the top and bottom walls of the socket, wherein the stem extends from the base at a second angle from horizontal and the first side is an opposite side of the stem from the second side;
    wherein, with the motion sensor body in an upright position and the stem of the mount inserted into the socket and held in place by magnetic attraction between the first magnetic material and the second magnetic material;
        the functionality plane of the motion sensor body is set at an angle from horizontal equal to the first angle plus the second angle if the mount is affixed to the vertical wall in the first orientation; and
        the functionality plane of the motion sensor body is set at an angle from horizontal equal to the first angle minus the second angle if the mount is affixed to the vertical wall in the second orientation.

2. The motion sensor of claim 1, wherein the motion sensor body is set to a substantially fixed position with an azimuth angle of about zero degrees from the stem when the stem is inserted into the socket.

3. The motion sensor of claim 1, wherein the second angle is about 2.5 degrees.

4. The motion sensor of claim 1, further comprising:
    a first marking on the mount positioned to be upright if the mount is affixed to the vertical wall in the first orientation; and
    a second marking on the mount positioned to be upright if the mount is affixed to the vertical wall in the second orientation.

5. The motion sensor of claim 1, wherein the base is adapted to be affixed at an interior corner of the vertical wall.

6. The motion sensor of claim 1, the socket further comprising a concave rear-facing curved surface between the top wall and the bottom wall;
    wherein the distal end of the stem is variably positionable in the socket to set the motion sensor body at a plurality of azimuth angles between a first azimuth angle and a second azimuth angle.

7. The motion sensor of claim 6, comprising a first alignment mechanism to position the distal end of the stem at a first location in the socket to set the motion sensor body to the first azimuth angle of about 45 degrees;
    a second alignment mechanism to position the distal end of the stem at a second location in the socket to set the motion sensor body to the second azimuth angle of about −45 degrees; and
    a third alignment mechanism to position the distal end of the stem at a third location in the socket to set the motion sensor body to a third azimuth angle of about 0 degrees.

8. The motion sensor of claim 1, wherein the first magnetic material comprises steel shaped to form the rear-facing surface of the socket, and the second magnetic material comprises a magnet.

9. A method of mounting a motion sensor comprising:
    obtaining a motion sensor body comprising a socket and a detection pattern with a functionality plane bounding a top of the detection pattern, wherein the socket is recessed into a back side of the motion sensor body at a first angle from the functionality plane of the motion sensor body;
    obtaining a mount comprising a base and a stem, the base adapted to be affixed to a vertical wall in either a first orientation or a second orientation, a proximal end of the stem attached to the base, and a distal end of the stem formed to fit into the socket, wherein the stem extends from the base at a second angle from horizontal;
    selecting an orientation from the first orientation or the second orientation to use to affix the mount to the vertical wall based on a mounting height, a target coverage area, and the detection pattern of the motion sensor body;
    affixing the mount on the vertical wall in the selected orientation at the mounting height;
    inserting the stem into the socket with the motion sensor body in an upright position to situate the motion sensor body on the mount;
    wherein the functionality plane of the motion sensor body is set at an angle from horizontal equal to the first angle plus the second angle if the mount is affixed to the vertical wall in the first orientation; and
    the functionality plane of the motion sensor body is set at an angle from horizontal equal to the first angle minus the second angle if the mount is affixed to the vertical wall in the second orientation.

10. The method of claim 9, further comprising:
determining an azimuth angle for the motion sensor body based on the target coverage area and the detection pattern of the motion sensor body;
positioning the end of the stem at an appropriate location in the socket to set the motion sensor body at the determined azimuth angle.

11. A security apparatus comprising:
a sensor body comprising a socket, wherein the socket is recessed into the sensor body at a first angle from a functionality plane of the sensor body, the socket comprising a first wall and a second wall opposite from the first wall; and
a mount comprising a base and a stem, the base adapted to be affixed at a mounting plane, a proximal end of the stem attached to the base, and a distal end of the stem formed to fit into the socket, wherein the stem extends from the base at a second angle from a normal vector that is perpendicular to the mounting plane and the stem comprises a first side and a second side opposite from the first side;
wherein the functionality plane of the sensor body is set at an angle from the normal vector equal to the first angle plus the second angle if the stem is inserted into the socket with the first side of the stem in close proximity to the first wall of the socket; and
the functionality plane of the sensor body is set at an angle from the normal vector equal to the first angle minus the second angle if the stem is inserted into the socket with the first side of the stem in close proximity to the second wall of the socket.

12. The security apparatus of claim 11, further comprising:
a first marking on the mount positioned to be upright if the mount is affixed to a vertical surface in a first orientation with the first side of the stem facing up; and
a second marking on the mount positioned to be upright if the mount is affixed to the vertical surface in a second orientation with the second side of the stem facing up.

13. The security apparatus of claim 11, wherein the base is adapted to be affixed at an interior corner of two surfaces intersecting in the mounting plane.

14. The security apparatus of claim 11, wherein the sensor body is set to a substantially fixed position with respect to the mount when the stem is inserted into the socket.

15. The security apparatus of claim 11, wherein the sensor body is pivotable on the stem in a plane parallel to the stem.

16. The security apparatus of claim 11, wherein the first wall and the second wall of the socket are substantially flat, and the socket further comprises a curved rear-facing surface between the first wall and the second wall; and
the first side and second side of the stem are substantially flat and are formed to fit into the socket in close proximity to the first and second wall of the socket when the distal end of the stem is inserted into the socket;
wherein the distal end of the stem is positionable at a first location in the socket to set the sensor body at a first azimuth angle from the stem; and
the distal end of the stem is positionable at a second location in the socket to set the sensor body at a second azimuth angle from the stem.

17. The security apparatus of claim 16, wherein the curved rear-facing surface of the socket is shaped as a section of a sphere with a given diameter, and the distal end of the stem is shaped as a section of a sphere with a diameter about the same as the given diameter.

18. The security apparatus of claim 16, wherein the distal end of the stem is variably positionable in the socket to set the sensor body at a plurality of azimuth angles between the first azimuth angle and the second azimuth angle.

19. The security apparatus of claim 18, wherein the first azimuth angle is equal to about 45 degrees to the right of the stem, and the second azimuth angle is equal to about 45 degrees to the left of the stem.

20. The security apparatus of claim 16, wherein an alignment mechanism is used to position the distal end of the stem in the first location in the socket.

21. The security apparatus of claim 20, wherein the alignment mechanism comprises a sub-socket or a detent in the rear-facing surface of the socket, a detent on the first or second wall of the socket, or a visible marking on the sensor body.

22. The security apparatus of claim 16, further comprising:
a first magnet positioned near the distal end of the stem with a first magnetic pole facing the distal end of the stem;
a second magnet placed near the first location in the socket with a magnetic pole opposite of the first magnetic pole facing into the socket; and
a third magnet placed near the second location in the socket with a magnetic pole opposite of the first magnetic pole facing into the socket.

23. The security apparatus of claim 11, wherein the socket comprises a first magnetic material, and the distal end of the stem comprises a second magnetic material, and the distal end of the stem is held in the socket by magnetic force.

24. The security apparatus of claim 23, wherein the first magnetic material comprises steel, and the second magnetic material comprises a magnet.

25. The security apparatus of claim 24, wherein the steel magnetic material snaps into a cavity on the back of the sensor body to form at least part of the socket.

26. The security apparatus of claim 23, wherein the first magnetic material comprises one or more magnets placed near the socket with a magnetic pole facing into the socket, and the second magnetic material comprises a magnet with an opposite magnetic pole facing the distal end of the stem.

* * * * *